(12) United States Patent
Op de Beeck

(10) Patent No.: US 7,781,349 B2
(45) Date of Patent: Aug. 24, 2010

(54) METHOD AND SYSTEM FOR OPTIMIZING A BARC STACK

(75) Inventor: Maria Op de Beeck, Heverlee (BE)

(73) Assignee: IMEC, Leuven (BE)

( * ) Notice: Subject to any disclaimer, the term of this patent is extended or adjusted under 35 U.S.C. 154(b) by 1230 days.

(21) Appl. No.: 11/224,415

(22) Filed: Sep. 12, 2005

(65) Prior Publication Data

US 2007/0059847 A1    Mar. 15, 2007

(51) Int. Cl.
*H01L 21/469* (2006.01)
*G03F 1/00* (2006.01)

(52) U.S. Cl. .......................... 438/761; 430/5

(58) Field of Classification Search .......... 430/5, 430/311; 438/7, 761, 952
See application file for complete search history.

(56) References Cited

U.S. PATENT DOCUMENTS

| | | | |
|---|---|---|---|
| 6,373,553 B1 * | 4/2002 | Singh ............................ | 355/55 |
| 7,460,981 B2 | 12/2008 | Bultman et al. | |
| 2002/0097493 A1 * | 7/2002 | Li et al. ....................... | 359/589 |
| 2004/0091789 A1 | 5/2004 | Han et al. | |
| 2004/0165271 A1 | 8/2004 | Krautschik et al. | |
| 2005/0151969 A1 | 7/2005 | Ke et al. | |
| 2005/0153540 A1 | 7/2005 | Mimotogi et al. | |
| 2006/0236294 A1 | 10/2006 | Saidin et al. | |
| 2006/0285120 A1 | 12/2006 | Aiyer et al. | |
| 2007/0015082 A1 * | 1/2007 | Angelopoulos et al. .. | 430/270.1 |

| | | |
|---|---|---|
| 2007/0059849 A1 | 3/2007 | Op de Beeck |

FOREIGN PATENT DOCUMENTS

EP    1016930 A1  *  7/2000

OTHER PUBLICATIONS

Chris A. Mack, "The Lithography Expert: Designing a bottom antireflective coating," Microlithography World, dated Feb. 2005.
Commonly owned and copending U.S. Appl. No. 11/224,361.
Commonly owned and copending U.S. Appl. No. 11/224,367 filed Sep. 12, 2005.

* cited by examiner

*Primary Examiner*—Mark F Huff
*Assistant Examiner*—Jonathan Jelsma
(74) *Attorney, Agent, or Firm*—McDonnell Boehnen Hulbert & Berghoff LLP

(57) ABSTRACT

In the present invention, a BARC stack comprising at least a first BARC layer and at least a second BARC layer is optimized for reducing substrate reflectivity in lithographic processing applications. The first BARC layer is positioned adjacent the resist layer, while the second BARC layer is positioned adjacent the first BARC layer. The optical parameters of the first BARC layer are determined to be slightly different from the optical parameters of the resist, thus resulting in a small optical step at the interface resist/first BARC. Furthermore, the second BARC may be selected to have optical parameters such that the optical step at the interface first BARC/second BARC is slightly larger but still relatively small compared to the optical step between resist and substrate. The thicknesses for the BARC layers can be determined from substrate reflectivity calculations. The latter allows obtaining a low substrate reflectivity for various pitches in a pattern to be printed.

11 Claims, 25 Drawing Sheets

METHOD AND SYSTEM FOR OPTIMIZING A BARC STACK

FIELD

The present invention relates to lithographic processing of devices. More particularly, the present invention relates to the use of a stack of bottom anti-reflective coatings to control substrate reflectivity in lithography applications, such as in high numerical aperture lithography applications like immersion lithography.

BACKGROUND

In the production of today's integrated circuits, optical lithography is one of the key techniques. The ongoing miniaturization of integrated circuits or other devices results in a number of problems, which may be encountered during optical lithography. When, in an optical lithographic system, light generated by a light source is incident on a mask, the light will be diffracted. The smaller the dimensions of the structures on this mask, the more the light will spread. Hence, the smaller the dimensions of the structures on the mask, the less of this spread-out light will be collected by an objective lens so as to be focused onto a resist layer. As a result, the image of the mask structure formed onto the resist layer will be of a low quality. A well known solution to cope with the light spreading and consequently to obtain sufficient quality of the mask image is the use of systems having a high numerical aperture (NA). Typically, immersion fluids are used to deal with the corresponding incidence of light having a high angle of incidence onto the wafer.

Light, which propagated through the resist, is typically partially reflected back into the resist by the substrate on which this resist has been deposited. The latter may lead to multiple interference effects, resulting in a lowered quality of the obtained print. Multiple interference effects result in a variation of intensity with resist depth, causing a variation of the development rate with resist depth. As a result, the resist sidewalls have a scalloped profile or so called 'standing waves.' This standing wave problem will cause pattern collapse of lines in defocus, strongly pronounced standing waves at the bottom of the resist line, or incomplete development of lines or contacts holes, especially in defocus.

The multiple interference effects in resist will result in a variation of total absorbed energy with resist thickness, hence in a variation of the critical dimension (CD) with resist thickness. The latter is known as the 'swing effect,' which will cause CD non-uniformity if patterns have to be made on substrates with topography. These multiple interference effects in the resist, and hence the total amount of energy absorbed, will also depend on the layers underneath the resist and variations thereof in thickness and/or composition. For example, the interference effects will be different if a contact hole is to be printed in a resist layer on top of an oxide or on top of a nitride layer, as both dielectric layers have different optical properties, such as transparency.

In lithography applications, typically bottom anti-reflective coatings (BARC) or bottom anti-reflective layers (BARL) are used underneath the resist to decrease the effects of multiple interference due to reflection by the substrate. As used herein, the term bottom anti-reflective coating will be used to refer to both BARC and BARL, as commonly used by persons skilled in the art.

Using bottom anti-reflective coatings, the reduction in substrate reflectivity can take place in two ways: by absorption of light in the BARC or by destructive interference of light rays at the bottom of the resist. The latter is illustrated in FIG. 1, showing a part 100 of a lithographic process step. A device 102 is covered by a resist layer 104, and a BARC 106 is sandwiched between the device 102 and the resist layer 104. The light rays 108 show the situation whereby light is absorbed in the BARC, which is only possible if the BARC is sufficiently thick. Unfortunately, the etching of a thick BARC layer with the resist as a mask is often a problem due to excessive resist erosion.

The light rays 110 show the situation whereby reflection is reduced by destructive interference, which is only possible if the BARC thickness is everywhere exactly the same, causing the required phase difference between the interfering light rays. The latter even may be obtained on topographical substrates, e.g., using inorganic BARC's. Some BARC's, such as inorganic BARC's, show planarization over topography, causing BARC thickness variations. Hence organic BARC's are typically used combining interference effects and absorption in order to reduce the substrate reflectivity on topographic substrates.

The patent application entitled "Method and system for BARC optimization for high numerical aperture applications" by IMEC vzw, co-pending herewith, describes the optimization of a single BARC layer depending on the pattern, i.e. pitches, on the mask used. If large ranges of pitches need to be patterned, a single BARC layer does not allow sufficient control of the reflections towards the resist layer for all pitches. Consequently a stack of bottom anti-reflective coatings may be used. Nevertheless, optimizing the BARC stack may be very time consuming. For example, for a dual BARC system, six parameters need to be optimized for all pitches under consideration simultaneously. These six parameters are the real refractive index, extinction coefficient, and thickness of each BARC. The latter is very time-consuming.

SUMMARY

An improved apparatus and methods for setting up lithographic processing of a substrate that provides an efficient way for optimizing the optical parameters of a stack of bottom anti-reflective coatings is described.

A method for setting up lithographic processing of a substrate using a stack comprising a number B of bottom anti-reflective coatings in between a resist layer and the substrate, creating a number of optical interfaces, is described. The bottom anti-reflective coatings have at least a first bottom anti-reflective coating adjacent the resist layer and at least a second bottom anti-reflective coating adjacent the first bottom anti-reflective coating. The method includes selecting optical parameters of each of the bottom anti-reflective coatings such that an optical step at an interface resist/first bottom anti-reflective coating is smaller than an average optical step per interface for traversing from the resist to the substrate.

As used herein, optical step means the difference in complex refractive index. The requirements for the optical step may be fulfilled for both the real part and the imaginary part of the optical step, i.e., both the optical step in real refractive index n and in extinction coefficient k. The average optical step per interface may be determined as the optical step between the resist and the substrate divided by the total number of interfaces which is equal to the summation of the number of BARCS with 1.

Selecting the optical parameters may include selecting a real refractive index $n_{1BARC}$ and an extinction coefficient $k_{1BARC}$ of the first bottom anti-reflective coating such that the optical step at the interface resist/first bottom anti-reflective coating is less than the average optical step per interface $\Delta_{resist/substrate}/(B+1)$, preferably less than 80% of the average optical step per interface $\Delta_{resist/substrate}/(B+1)$, more preferably less than 60% of the average optical step per interface $\Delta_{resist/substrate}/(B+1)$ or less than 40% of the average optical step per interface $\Delta_{resist/substrate}/(B+1)$ or less than 20% of the average optical step per interface $\Delta_{resist/substrate}/(B+1)$.

The method may further include selecting a real refractive index $n_{2BARC}$ and an extinction coefficient $k_{2BARC}$ of the second bottom anti-reflective coating such that the optical step at the interface first bottom anti-reflective coating/second bottom anti-reflective coating, is less than the average optical step per interface $\Delta_{resist/substrate}/(B+1)$, preferably less than 80% of the average optical step per interface $\Delta_{resist/substrate}/(B+1)$, more preferably less than 60% of the average optical step per interface $\Delta_{resist/substrate}/(B+1)$ or less than 40% of the average optical step per interface $\Delta_{resist/substrate}/(B+1)$ or less than 20% of the average optical step per interface $\Delta_{resist/substrate}/(B+1)$, and the optical step at the interface first bottom anti-reflective coating/second anti-reflective coating is larger than the optical step at the interface resist/first bottom anti-reflective coating.

The extinction coefficients of the BARC layers may be selected to be increasing at each optical interface, when traversing from resist to substrate.

The real refractive indices of the BARC layers may be selected to be decreasing at each optical interface, when traversing from resist to substrate.

The real refractive index of the second bottom anti-reflective layer may be selected to be higher than the real refractive index of the resist layer. The latter may allow a higher flexibility in the selection of suitable BARC materials. The latter may allow reduction of the angle of incidence of the incident light rays.

The thickness of the first bottom anti-reflective coating and the thickness of the second bottom anti-reflective coating may be obtained by selecting values for each of the thickness parameters, determining the substrate reflectivity based on the selected values for each of the thickness parameters, and evaluating whether the reflectivity is equal to or smaller than a maximum allowable reflectivity. The evaluating may include accepting the values for each of the thickness parameters if the substrate reflectivity is equal to or smaller than a maximum allowable substrate reflection and/or rejecting the set of selected process parameter values if the substrate reflectivity is larger than a maximum allowable substrate reflection. After rejecting, the method may include repeating the steps of selecting, determining, and evaluating.

If the substrate reflectivity is equal to or smaller than a maximum allowable substrate reflection, the evaluating also may include ranking the lithographic processing determined by the set of selected process parameter values. The ranking may be performed as a function of the determined substrate reflectivity.

The method may also include, prior to the determining the reflectivity, selecting values for a thickness of the substrate or layers thereof. The determining the reflectivity in the resist layer is based on the selected thickness of the substrate or layers thereof.

The maximum allowable reflectivity may be determined as a function of a normalized image log-slope related parameter for the lithographic processing. The latter may allow, for specific applications, finding a suitable BARC layer whereas this would not be the case if a fixed criterion for the maximum allowable reflectivity is used. Below a predetermined NILS value the maximum allowable substrate reflectivity may be an increasing function of the normalized image log-slope. For NILS values smaller than a predetermined value, the maximum allowable substrate reflection may be proportional to the NILS. The proportionality factor is a constant determined by the selected resist process, the selected resist thickness, and/or the required CD control.

The substrate reflectivity may be determined taking into account an angle of incidence of light rays incident on the substrate, the BARCs, and/or the resist layer. The latter may allow, for specific applications, obtaining a sufficiently smaller reflectivity than for BARC thickness optimization based on reflectivity calculations based on perpendicular incident light. The angle of incidence may be defined as the angle of incidence with respect to the substrate, BARC layers, and/or resist layer, determined by the angle between the normal on the substrate, BARC layers, and/or resist layer and the incident light ray. The substrate reflectivity may further be determined by taking into account a polarization state and/or an amplitude of light rays incident on the substrate, the BARCs, and/or the resist layer.

A method for lithographic processing of a device is also described. The lithographic processing includes using a stack comprising a number B of BARC layers in between a resist and a substrate. The BARC layers include at least a first bottom anti-reflective coating and at least a second bottom anti-reflective coating. The at least one first bottom anti-reflective coating and the at least one second bottom anti-reflective coating are selected by selecting the optical parameters of each of the bottom anti-reflective coatings such that an optical step at the interface resist/first bottom anti-reflective coating is smaller than an average optical step per interface for traversing from the resist to the substrate.

A computer program product for executing a method for setting up lithographic processing of a substrate is also described. The method includes using a stack having a number B of bottom anti-reflective coatings in between a resist layer and the substrate, creating a number of optical interfaces. The bottom anti-reflective coatings have at least a first bottom anti-reflective coating adjacent the resist layer and at least a second bottom anti-reflective coating adjacent the first bottom anti-reflective coating. The method includes selecting optical parameters of each of the bottom anti-reflective coatings such that an optical step at an interface resist/first bottom anti-reflective coating is smaller than an average optical step per interface for traversing from the resist to the substrate.

A machine readable data storage device storing such a computer program product and/or transmission of such a computer program product over a local or wide area telecommunications network is also described.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

As used herein, substrate reflectivity means the amount of light reflected back into the resist layer, including the light reflected by any of the layers underlying the resist layer or the stack of resist layers.

Figure 1:
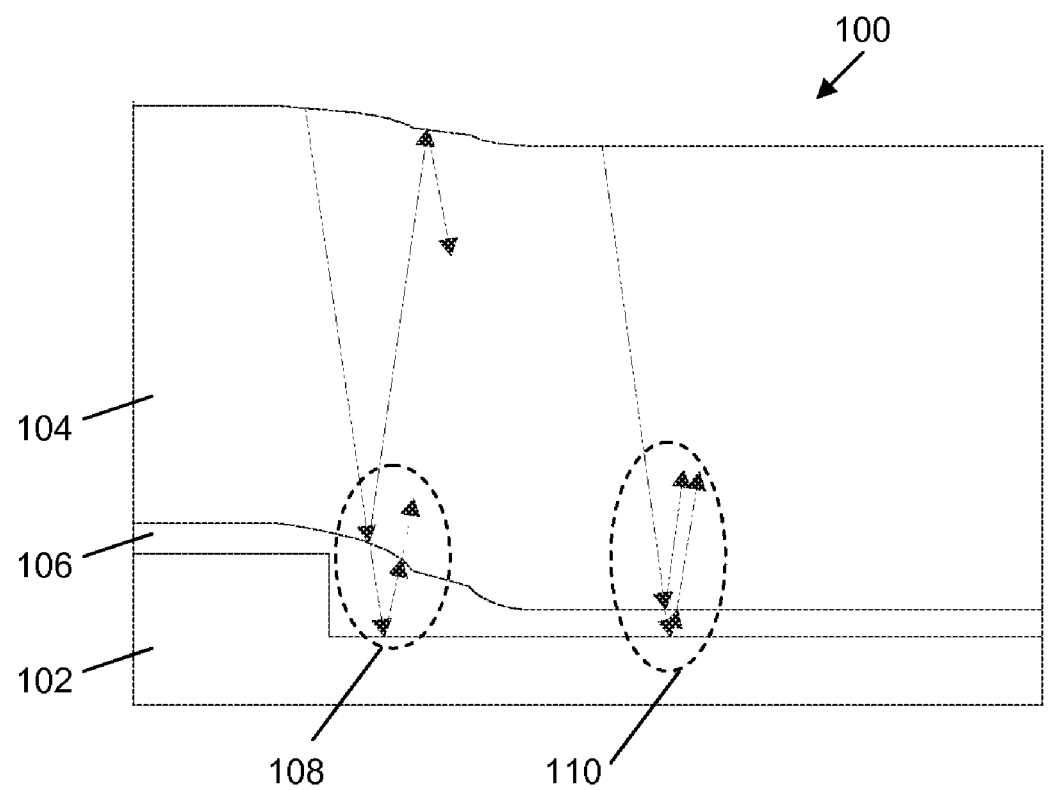
FIG. 1 is a schematic illustration of two principles of operation of a bottom anti-reflective layer for incident light rays.
Figure 2:
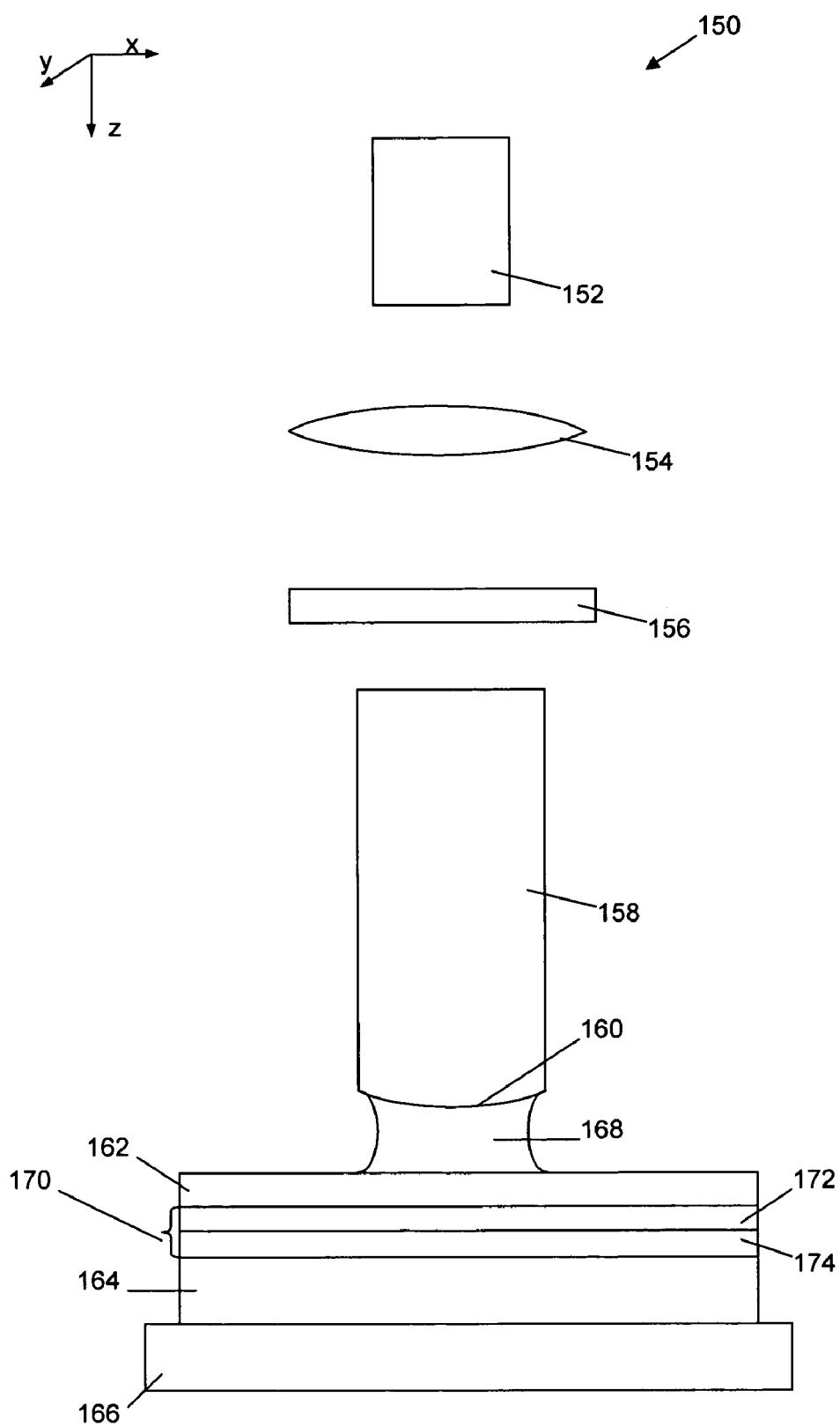
FIG. 2 is a schematic illustration of a lithographic system that can be used for lithographic processing set up according to embodiments of the present invention.

In a first embodiment, the present invention relates to a method for setting up lithographic processing of a substrate. The method is especially suitable for setting up lithographic processing of a substrate whereby high numerical aperture (NA) lithography is used (e.g., NA>0.85) and whereby a wide range of pitches is to be patterned. The method is applicable to lithographic processing which can be performed on any type of lithographic set-up, such as but not limited to the set-up shown in FIG. 2. An optical lithographic system with a transmission set-up is shown, although the invention is not limited thereto and is also applicable to a system with a reflection set-up. For example, the system may be a lithographic stepper system or a lithographic scanner system.

The optical lithographic system 150 typically comprises a source of electromagnetic radiation, such as a light source 152. The light from the light source 152 typically is transmitted through an optical system 154 comprising a lens and is incident on a mask 156. The mask 156 contains information about the image to be generated in a resist layer and is basically defined thereby. Typically, the mask 156 may be part of a set of masks used for creating a device or circuit using lithography. Different types of masks exist, such as an alternating phase shift mask, an attenuated phase shift mask, and a binary mask.

The light, carrying the mask information, is then passed through an imaging module 158, which may have a final lens surface 160, and is guided to a resist layer 162 on a substrate 164. The optics of the imaging module 158 inherently defines the numerical aperture (NA) of the imaging module 158. It is well known by a person skilled in the art that the wider the numerical aperture, the more light (e.g., diffracted by the mask 156) can be collected.

The substrate 164 typically is mounted on a substrate stage 166. Optionally, in case of immersion lithography, an immersion fluid 168 is provided between the resist layer 162 and the output of the imaging module 158 (e.g., the final lens surface 160) in order to allow increase of the numerical aperture of the system 150. In order to reduce substrate reflection, a bottom anti-reflective coating stack 170 having at least a first bottom anti-reflective coating (BARC) 172 and a second bottom anti-reflective coating (BARC) 174 is provided between the resist layer 162 and the substrate 164. It is to be noticed that such optical lithographic systems 150 are well known by a person skilled in the art, including optional and/or additional components not illustrated in FIG. 2.

In the first embodiment, the invention relates to a method for setting up lithographic processing of a substrate, whereby optimization of a stack of bottom anti-reflective coatings is performed. The stack of bottom anti-reflective coatings includes at least a first bottom anti-reflective coating 172 that is typically adjacent to the resist layer 162 and at least a second bottom anti-reflective coating 174 that is adjacent to the first bottom anti-reflective coating 172. Although further bottom anti-reflective coatings may be provided between the second bottom anti-reflective coating 174 and the substrate 164, thereby not departing from the spirit and scope of the present invention, the examples shown will be based on a dual BARC system (i.e., whereby the BARC stack 170 consists of a first bottom anti-reflective coating 172 and a second bottom anti-reflective coating 174).

The method according to the present invention is especially useful for systems having a substrate or layers thereof that substantially absorb the light that passes the BARC stack and for systems having a semi-transparent substrate or layers thereof such that different light reflections occur from the substrate back into the BARC stack. In the first case, the substrate material may have a high absorption coefficient or may be sufficiently thick such that only a single reflection, at the top surface of the substrate, occurs back into the BARC stack. In the second case, if semi-transparent material is positioned under the BARC stack, multiple reflections at the top and bottom interface with the semi-transparent material(s) occur. This might be the case for a nitride top layer in the substrate. In this case, optical parameters, such as the thickness, of the semi-transparent material may be used in the substrate reflectivity optimization for the system.

The method also can be applied for systems having a substrate with a low extinction coefficient, such as less than 0.2, albeit possibly less efficient. For such systems, the method may be extended incorporating the optical parameters of further layers in the substrate.

The method according to the first embodiment provides a way of efficiently selecting the optical parameters of the bottom anti-reflective coatings 172, 174 of the stack 170. The first BARC 172 is positioned adjacent the resist layer 162 (i.e., closest to the resist layer 162 compared to other BARC layers), whereas the second BARC layer 174 is positioned adjacent the resist layer 162, between the first BARC 172 and the substrate 164.

The method comprises selecting the first bottom anti-reflective coating 172 such that, when traversing from the resist layer to the substrate, at the first interface the optical step is smaller than the average optical step per interface. The latter may be quantified as follows. For a total optical step $\Delta_{resist/substrate}$, i.e., the difference between the complex refractive indices of two optical layers or corresponding therewith the differences between respective real refractive index and extinction coefficient values of two optical layers, and a total number of BARCs B in the BARC stack, i.e., the number of layers between the resist layer 162 and the substrate 164, an average optical step per interface can be defined as $\Delta_{resist/substrate}/(B+1)$.

The optical step thereby may be expressed as:

$$\Delta_{resist/substrate} = (n_{substrate} - n_{resist}) + i(k_{substrate} - k_{resist})$$

with $n_{substrate}$ and $n_{resist}$ the real refractive indices of the substrate and the resist and $k_{substrate}$ and $k_{resist}$ being the extinction coefficients of the substrate and the resist. The complex refractive index of the substrate is expressed as:

$$\tilde{n}_{substrate} = n_{substrate} + ik_{substrate}$$

and the complex refractive index of the resist is expressed as $$\tilde{n}_{resist} = n_{resist} + ik_{resist}$$

The optical step comprises a real part, being the optical step for real refractive indices, and a complex part, being the optical step for the extinction coefficients.

The method according to the first embodiment of the present invention includes selecting the real refractive index $n_{1BARC}$ respectively the extinction coefficient $k_{1BARC}$ of the first bottom anti-reflective coating 172 such that the optical step at the first interface (i.e., the interface resist 162/first bottom anti-reflective coating 172) is less than the average optical step per interface $\Delta_{resist/substrate}/(B+1)$, preferably less than 80% of the average optical step per interface $\Delta_{resist/substrate}/(B+1)$, more preferably less than 60% of the average optical step per interface $\Delta_{resist/substrate}/(B+1)$ or less than 40% of the average optical step per interface $\Delta_{resist/substrate}/(B+1)$ or less than 20% of the average optical step per interface $\Delta_{resist/substrate}/(B+1)$. The latter may be fulfilled for both the real part and the imaginary part of the optical step, i.e., both the optical step in real refractive index n and in extinction coefficient k.

It is an advantage of the present embodiment that the optical step at the first interface is very small, since a large difference in n and/or k will result in an important reflection, which is not absorbed by any of the BARC layers. Hence the first interface may play an important role with respect to reflection control.

The method furthermore comprises selecting a real refractive index $n_{2BARC}$ and an extinction coefficient $k_{2BARC}$ of the second BARC, and if present, any other BARC in the BARC stack, by choosing a second BARC material, and if present, by choosing the other BARC materials. The latter may include selecting the second BARC 174, or more particularly the real refractive index $n_{2BARC}$ and the extinction coefficient $k_{2BARC}$, such that the optical step at the second interface (i.e., the first bottom anti-reflective coating 172/second bottom anti-reflective coating 174) is less than the average optical step per interface $\Delta_{resist/substrate}/(B+1)$, preferably less than 80% of the average optical step per interface $\Delta_{resist/substrate}/(B+1)$, more preferably less than 60% of the average optical step per interface $\Delta_{resist/substrate}/(B+1)$ or less than 40% of the average optical step per interface $\Delta_{resist/substrate}/(B+1)$ or less than 20% of the average optical step per interface $\Delta_{resist/substrate}/(B+1)$, and the optical step at the second interface is larger than the optical step at the first interface. The latter may be fulfilled for both the real part and the imaginary part of the optical step, i.e., both the optical step in real refractive index n and in extinction coefficient k.

It may be an advantage of embodiments of the present invention that the optical step at the second interface, i.e., between the first and the second BARC is not very large, since resulting reflections are hardly absorbed by the top-BARC due to its typical low k-value. The real refractive index $n_{2BARC}$ of the second BARC 174 may be larger than or smaller than the real refractive index $n_{resist}$ of the resist layer 162. If the real refractive index $n_{2BARC}$ of at least the second BARC 174, but preferably of both or of all BARCs, is larger than the real refractive index $n_{resist}$ of the resist layer 162, the angle of incidence for the light incident on the surface of the BARC layers and/or substrate 164 typically is reduced, resulting in a lowered reflectivity.

In a specific embodiment, selection of the optical parameters of each of the bottom anti-reflective coatings may be performed such that, when traversing from the resist layer to the substrate, at each interface, the optical step is larger than at the previously passed interface. It is an advantage of embodiments according to the present invention that, by selecting higher n-values especially for the bottom-BARC, the light rays will penetrate easier through the last interface and will be absorbed by the substrate.

The method further may include determining the optimum thicknesses of the BARCs present in the stack 170 based on substrate reflectivity calculations. In case of an absorbing substrate or layers thereof whereby only a single reflection occurs back into the BARC at the surface of the substrate, typically only the real refractive index and the extinction coefficient of the top of the substrate needs to be taken into account, i.e. for determining the last optical step and the total optical step. In case of a semi-transparent substrate or layers thereof, typically, for determining the thicknesses of the layers in the BARC stack, also the thickness of the semi-transparent substrate or layers thereof are included as parameters in the optimization procedure.

For selection of the thicknesses in the optimization procedure, a trial and error technique may be used, preferred thicknesses may be applied, or variation of thicknesses may be performed in steps. The ranges wherein the thicknesses of the different layers are optimized typically also depend on practical and experimental considerations with respect to other processing steps, such as etching and deposition. Determining the optimum thicknesses of the BARCs 172, 174 may be performed by selecting values for each of the thickness parameters, determining the substrate reflectivity based on the selected values for each of the thicknesses, and evaluating whether the reflectivity is equal to or smaller than a maximum allowable substrate reflectivity.

Determining the reflectivity may be performed by simulation. For example, simulation software may be used, such as, but not limited to, Solid-c (e.g., version 6.5.0.1) from Sigma- C. Such reflectivity calculations may be performed with the supposition that the incident light rays have normal incidence on the surfaces of the resist layer, BARCs, and/or substrate, or, more preferably, the reflectivity calculations may be performed taking into account the angle of incidence of the incident light rays. Furthermore, preferably the optical parameters of all components are taken into account.

For evaluating whether the reflectivity is equal to or smaller than a maximum allowable substrate reflectivity, a fixed criterion, e.g., substrate reflectivity lower than 0.5%, or a floating criterion may be used. Surprisingly, it has been found that the maximum allowable substrate reflectivity preferably is not a constant, but depends on the normalized image log-slope (NILS), or to a parameter related thereto. The normalized image log-slope may be defined as the slope of the natural logarithm of the intensity plot, i.e., the so-called aerial image whereby the image of the photomask is projected onto the plane of the substrate assuming air is present instead of resist.

The floating criterion for the maximum allowable substrate reflectivity may be expressed as:

$$\text{max.allowable amount of substrate reflectivity} = f(\text{NILS}).$$

The maximum allowable substrate reflectivity may be such that the maximum allowable substrate reflectivity is smaller for a small NILS, and larger for a large NILS. In other words, the maximum allowable substrate reflectivity may be a positive function of the NILS or a NILS-related parameter following the same trend as the NILS.

Further, in a first approximation, the maximum allowable substrate reflectivity may be expressed as being proportional to the NILS:

$$\text{max.allowable amount of reflected light in resist} = c.\text{NILS}$$

with c being a constant that depends on various parameters, such as resist process, resist thickness, the required critical dimension control, and so on.

The floating criterion may allow further quality improvement of the lithographic print. Evaluating may either result in selecting other values for part or all of the optical parameters of the BARC stack if the criterion requirements are not obtained for all relevant pitches or may comprise using the values of the optical parameters of the BARC stack and/or ranking the set of optical parameters of the BARC stack if, for all pitches, the substrate reflectivity is sufficiently low.

Figure 3:
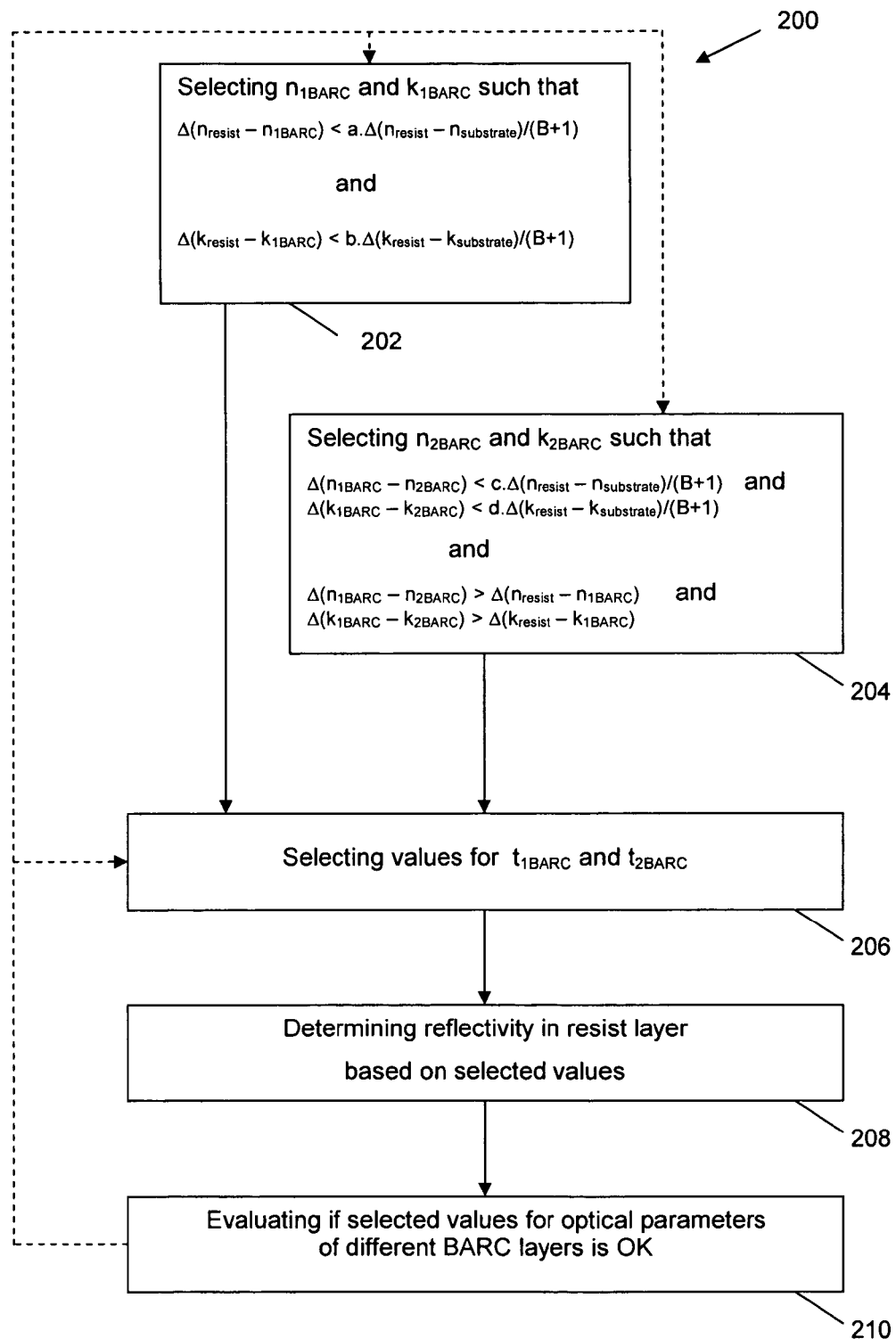
FIG. 3 is a schematic illustration of different steps that can be performed according to the method of the first embodiment of the present invention.

Basic and optional steps of the method are illustrated in FIG. 3, by way of example. Method 200 includes selecting a real refractive index $n_{1BARC}$ and an extinction coefficient $k_{1BARC}$ for the first BARC layer 172, positioned adjacent the resist layer 162, such that the optical step $\Delta_{resist/first\,BARC}$ at the first interface, i.e., the interface resist/first bottom anti-reflective coating, is less than the average optical step per interface $\Delta_{resist/substrate}/(B+1)$, preferably less than 80% of the average optical step per interface $\Delta_{resist/substrate}/(B+1)$, more preferably less than 60% of the average optical step per interface $\Delta_{resist/substrate}/(B+1)$ or less than 40% of the average optical step per interface $\Delta_{resist/substrate}/(B+1)$ or less than 20% of the average optical step per interface $\Delta_{resist/substrate}/(B+1)$. The latter may be fulfilled for both the real part and the imaginary part of the optical step, i.e., both the optical step in real refractive index n and in extinction coefficient k leading to the requirement that:

$$\Delta(n_{resist}-n_{1BARC}) < a.\Delta(n_{resist}-n_{substrate})/(B+1) \text{ and}$$

$$\Delta(k_{resist}-k_{1BARC}) < b.\Delta(k_{resist}-k_{substrate})/(B+1)$$

with a and b positive numbers being less than 1, preferably less than 0.8, more preferably less than 0.6 or less than 0.4 or less than 0.2.

Selecting these parameters is performed at block 202. Besides selecting a real refractive index $n_{1BARC}$ and an extinction coefficient $k_{1BARC}$ for the first BARC 172, the method 200 also includes selecting a real refractive index $n_{2BARC}$ and an extinction coefficient $k_{2BARC}$ for the second BARC 174. The latter may be done by choosing a second BARC material. The latter also may be done such that the selection of the real refractive index $n_{2BARC}$ and the extinction coefficient $k_{2BARC}$ results in the optical step $\Delta_{first\,BARC/second\,BARC}$ at the second interface, i.e., the interface first bottom anti-reflective coating/second bottom anti-reflective coating, is less than the average optical step per interface $\Delta_{resist/substrate}/(B+1)$, preferably less than 80% of the average optical step per interface $\Delta_{resist/substrate}/(B+1)$, more preferably less than 60% of the average optical step per interface $\Delta_{resist/substrate}/(B+1)$ or less than 40% of the average optical step per interface $\Delta_{resist/substrate}/(B+1)$ or less than 20% of the average optical step per interface $\Delta_{resist/substrate}/(B+1)$. The latter may be fulfilled for both the real part and the imaginary part of the optical step, i.e., both the optical step in real refractive index n and in extinction coefficient k, leading to the requirement of $$\Delta(n_{1BARC}-n_{2BARC}) < c.\Delta(n_{resist}-n_{substrate})/(B+1) \text{ and}$$

$$\Delta(k_{1BARC}-k_{2BARC}) < d.\Delta(k_{resist}-k_{substrate})/(B+1)$$

with c and d positive numbers being less than 1, preferably less than 0.8, more preferably less than 0.6 or less than 0.4 or less than 0.2.

Furthermore, the selection of the real refractive index $n_{2BARC}$ and the absorption coefficient $k_{2BARC}$ of the second BARC may be done such that the optical step at the first interface is smaller than the optical step at the second interface, which can be expressed as:

$$\Delta(n_{resist}-n_{1BARC}) < \Delta(n_{1BARC}-n_{2BARC}) \text{ and}$$

$$\Delta(k_{resist}-k_{1BARC}) < \Delta(k_{1BARC}-k_{2BARC}).$$

Selection of the real refractive index $n_{2BARC}$ and the absorption coefficient $k_{2BARC}$ of the second BARC is done at block 204, which may be done simultaneously with block 202, prior to block 202, or after block 202.

At block 206, the remaining parameters of the BARC layers are selected. Based on the above determined optical parameters, the substrate reflectivity is determined at block 208. As discussed above, this may be done taking into account normal incidence or taking into account the angles of incidence of the light rays.

Furthermore, for determining the thicknesses of the layers in the BARC stack, also the thickness or thicknesses of the semi-transparent substrate or layer(s) of the substrate leading to multiple reflections back into the BARC stack may be used as optimization parameters. Selection of the thicknesses may be done based on trial and error, based on best estimated guesses, or stepwise selecting all thicknesses, for example, in a preferred thickness range for each thickness parameter that is taken into account.

At block 210, it is evaluated whether the selected values for the optical parameters are OK, i.e., whether the resulting substrate reflectivity will be small enough. Such evaluation may be performed with reference to a fixed maximum allowable substrate reflectivity or with reference to a floating criterion, in which the maximum allowable substrate reflectivity is a function of the normalized image log slope. If the selected optical parameters do not fulfill the criterion for maximum allowable substrate reflectivity, either other thicknesses may be selected, or if no suitable thicknesses are found, an alternative selection of real refractive index and the extinction coefficient may be performed.

It is an advantage of the present embodiment that it provides a method for efficiently optimizing a BARC stack. For example in a dual BARC stack, six parameters need to be optimized. The six parameters are the real refractive index, the extinction coefficient, and the thickness of each BARC. The latter is improved by the embodiment of the present invention, as it provides guidelines on how to select these parameters.

When optimizing a dual BARC layer, the most suitable n, k, and t of both the top and bottom BARC have to be defined, for a given resist and substrate, and a known immersion fluid (or air). It furthermore is an advantage of the present invention that a low substrate reflectivity can be found for all relevant pitches.

The basic and optional requirements can also be expressed as follows, $$\Delta^n_{resist/substrate} = \Delta^n_{resist/1BARC} + \Delta^n_{1BARC/2BARC} + \ldots + \Delta^n_{BBARC/substrate}$$

$$\Delta^k_{resist/substrate} = \Delta^k_{resist/1BARC} + \Delta^k_{1BARC/2BARC} + \ldots + \Delta^k_{BBARC/substrate}$$

and $$|\Delta^n_{resist/1BARC}| << |\Delta^n_{1BARC/2BARC}| < |\Delta^n_{BBARC/substrate}|$$

$$|\Delta_{resist/1BARC}^k| << |\Delta_{1BARC/2BARC}^k| < |\Delta_{BBARC/substrate}^k|$$

with $\Delta_{L1/L2}^n$ and $\Delta_{L1/L2}^k$ the real part of the optical step respectively complex part of the optical step between layer L1 and layer L2, or in other words with $\Delta_{L1/L2}^n$ and $\Delta_{L1/L2}^k$ the optical step in real refractive indices respectively the optical step in the extinction coefficients between layer L1 and layer L2. The last two conditions express relations for the absolute value of the optical steps.

In a second embodiment, the steps of the method of the first embodiment may be used as a method for selecting a BARC stack. Selecting a BARC stack may include selecting a real refractive index, an extinction coefficient, and the thickness of the BARC layers incorporated in the stack. These optical parameters are selected according to the method of the first embodiment. In other words the first bottom anti-reflective coating 172 may be selected such that the first optical step at the interface resist 162/first bottom anti-reflective coating 172 is substantially smaller than average optical step per interface. The same features as described in any of the previous embodiments may be present resulting in the same advantages.

The results of the optimization according to any of the previous embodiments may be used in a method for lithographic processing of a substrate 164. The method of lithographic processing of a substrate 164 includes using a BARC stack. The BARC layers have optical parameters determined such that the first optical step at the interface resist 162/first bottom anti-reflective coating 172 is substantially smaller than average optical step per interface.

In a further embodiment, the invention relates to a processing system wherein the method embodiments according to the present invention are implemented, or in other words, to a processing system adapted for performing a method 150 for setting up lithographic processing according to the present invention, whereby parameter values are selected for a BARC layers in a BARC stack used in the lithographic processing. The parameter values may be selected such that first optical step at the interface resist/first bottom anti-reflective coating is substantially smaller than average optical step per interface, as described in more detail in the first embodiment.

Figure 4:
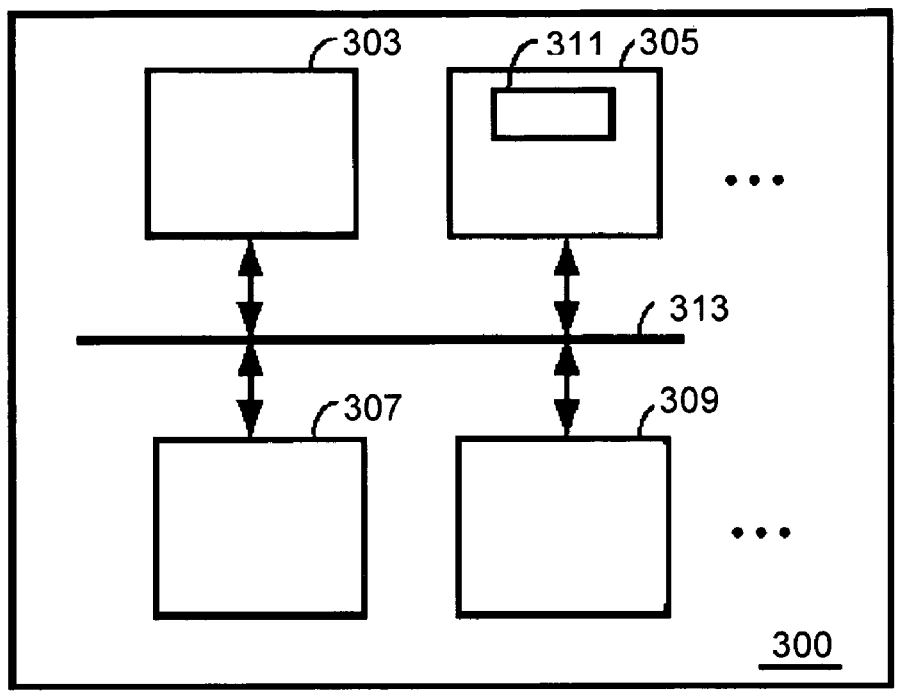
FIG. 4 is a schematic representation of a processing system that may be adapted for performing any of or part of the method embodiments according to the present invention.

Furthermore, if calculating the substrate reflectivity is performed, the latter may be done using the processing system. An exemplary processing system 300 is shown in FIG. 4. FIG. 4 shows one configuration of processing system 300 that includes at least one programmable processor 303 coupled to a memory subsystem 305 that includes at least one form of memory, such as RAM, ROM, and so forth. A storage subsystem 307 may be included that has at least one disk drive, CD-ROM drive, and/or DVD drive. In some implementations, a display system, a keyboard, and a pointing device may be included as part of a user interface subsystem 309 to provide for a user to manually input information. Ports for inputting and outputting data also may be included. More elements such as network connections, interfaces to various devices, and so forth, may be included, but are not illustrated in FIG. 4.

The various elements of the processing system 300 may be coupled in various ways, including via a bus subsystem 313 shown in FIG. 4. For simplicity the bus subsystem 313 is shown as a single bus, but is understood to those in the art to include a system of at least one bus. The memory of the memory subsystem 305 may at some time hold part or all (in either case shown as 311) of a set of instructions that when executed on the processing system 300 implement the method embodiments described herein.

It is to be noted that the processor 303 or processors may be a general purpose or a special purpose processor, and may be part of a device (e.g., a chip) that has other components that perform other functions. Thus, one or more aspects of the present invention can be implemented in digital electronic circuitry, or in computer hardware, firmware, software, or in various combinations. Furthermore, aspects of the invention can be implemented in a computer program product tangibly embodied in a carrier medium carrying machine-readable code for execution by a programmable processor.

Part or all of the methods of the invention may be performed by a programmable processor executing instructions to perform functions of those methods by operating on input data and generating output data. Accordingly, the present invention includes a computer program product which provides the functionality of any of the methods according to the present invention when executed on a computing device. Further, the present invention includes a data carrier such as for example a CD-ROM or a diskette which stores the computer product in a machine-readable form and which executes at least one of the methods of the invention when executed on a computing device. Nowadays, such software is often offered on the Internet or a company Intranet for download, hence the present invention includes transmitting the computer product according to the present invention over a local or wide area network.

The advantages of the methods and systems according to the present invention will be further illustrated by way of three different examples. In these examples, dense lines with four pitches are selected as representative patterns: 500 nm (corresponds to low NA applications), 130 nm, 90 nm, and 72 nm pitch. Last pitches can only be resolved using hyper NA tools.

In a first example, results are shown for a selection of optical parameters for the BARC stack not complying with the embodiments of the present invention. In a second and third example, results are shown for a selection of optical parameters for the BARC stack complying with the embodiments of the present invention. The results are shown for optical systems having a resist coating with real refractive index 1.7135 and with extinction coefficient 0.016, and a silicon substrate. This will allow further illustration of the advantages of the embodiments of the present invention. In these examples, optical schemes are shown, whereby on one axis the n and k values of all layers are indicated, and on the other axis the thickness of each layer are indicated.

In a first example, substantially equal optical steps at each interface are chosen in order to obtain a gradual optical transition from the resist to the substrate, using a dual BARC stack. The latter is not in agreement with the methods and systems according to the present invention, but is provided by way of comparison with the following examples. The different optical steps that are to be taken, i.e., determined by the differences in real refractive index and extinction coefficient between two materials interfacing each other, are shown in an optical scheme in FIG. 5. The real refractive index is indicated with the full line, while the extinction coefficient is indicated with the dashed line.

The real refractive index of the resist (n=1.7) decreases gradually at each interface to become equal to 0.88, i.e., the real refractive index of the substrate, at the substrate. Similarly, the resist-extinction coefficient k-value (almost zero) increases gradually at each interface to become 2.78 in the substrate. The optical step at each interface is substantially equal and hence this solution corresponds to the most gradual optical transition between the resist 162 and the substrate 164.

Figure 5:
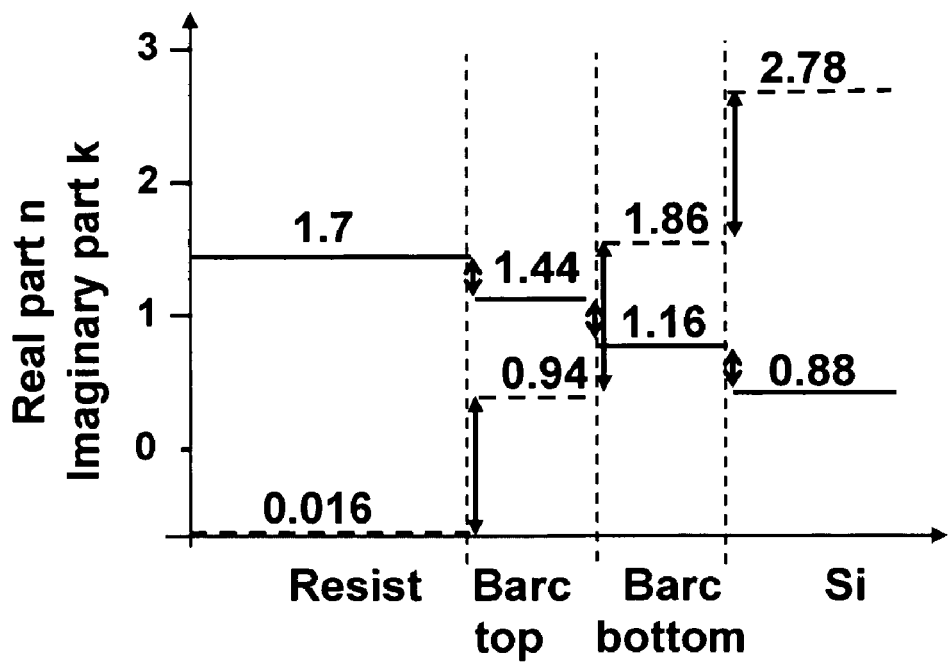
FIG. 5 shows an optical scheme for a system based on a dual BARC stack corresponding to the most gradual optical transition from resist to substrate, not in agreement with the embodiments according to the present invention.

FIG. 6a to FIG. 9c illustrate the results for simulations based on materials for the BARC stack resulting in the optical scheme shown in FIG. 5 and supposing an alternating phase shift mask, a numerical aperture of 1.43 and a degree of coherence being 0. These simulations are carried out using Solid-c software (version 6.5.0.1). The results are shown for three types of light polarization: unpolarized light (drawings indicated with sub-index a), Y-polarized light (drawings indicated with sub-index b), and X-polarized light (drawings indicated with sub-index c).

As used herein, Y-polarized light means light that is linearly polarized having an electric field vector in the same direction as the lines on the mask and X-polarized light means light that is linearly polarized having an electric field vector in a direction perpendicular to the lines on the mask.

Figure 6A:
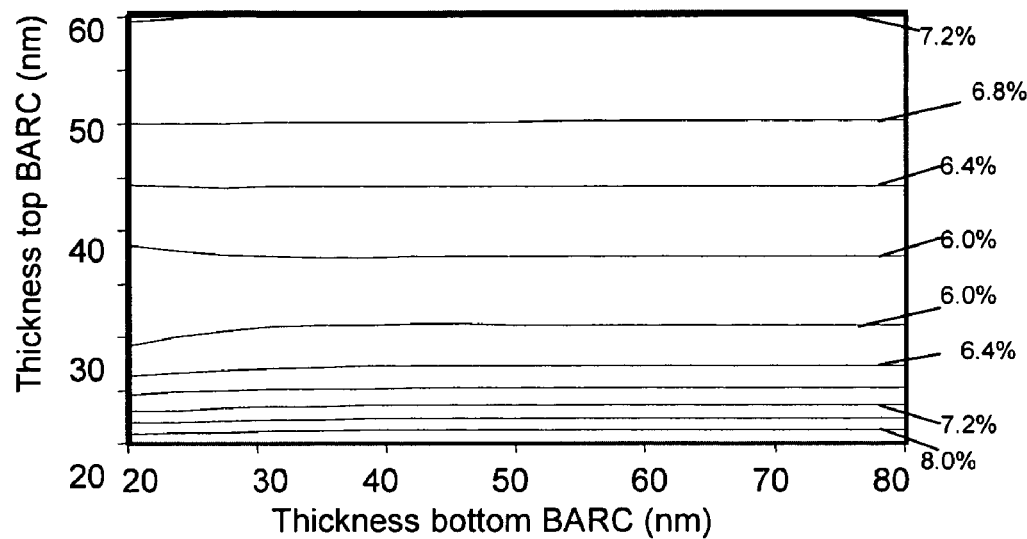
FIG. 6a to FIG. 9c show graphs of the substrate reflectivity as a function of the thicknesses of the BARC layers for a system as shown in FIG. 5 for an unpolarized light source (FIG. 6a, FIG. 7a, FIG. 8a, FIG. 9a), for an Y-polarized light source (FIG. 6b, FIG. 7b, FIG. 8b, FIG. 9b), and for an X-polarized light source (FIG. 6c, FIG. 7c, FIG. 8c, FIG. 9c) in case of a 500 nm pitch (FIG. 6a to FIG. 6c), a 130 nm pitch (FIG. 7a to FIG. 7c), a 90 nm pitch (FIG. 8a to FIG. 8c), and a 72 nm pitch (FIG. 9a to FIG. 9c)
Figure 6B:
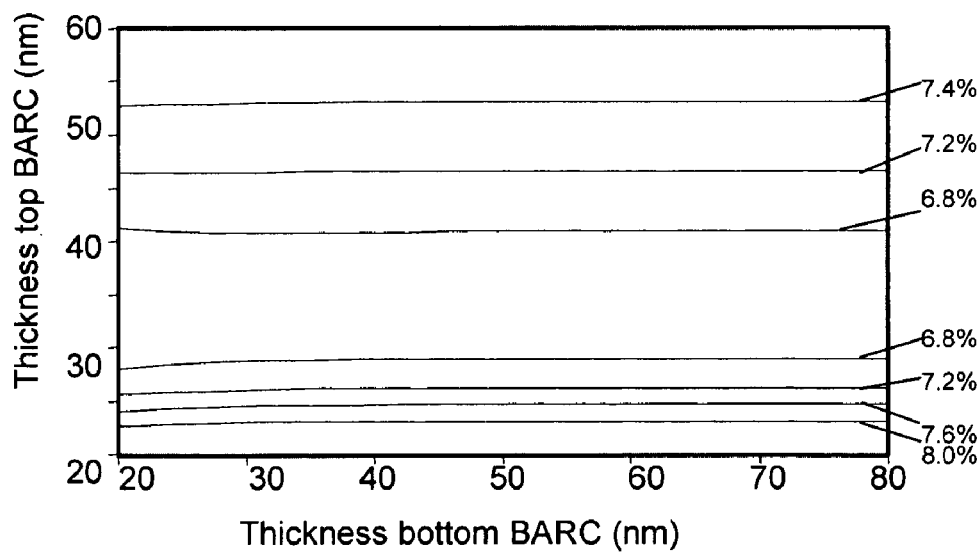
Figure 6C:
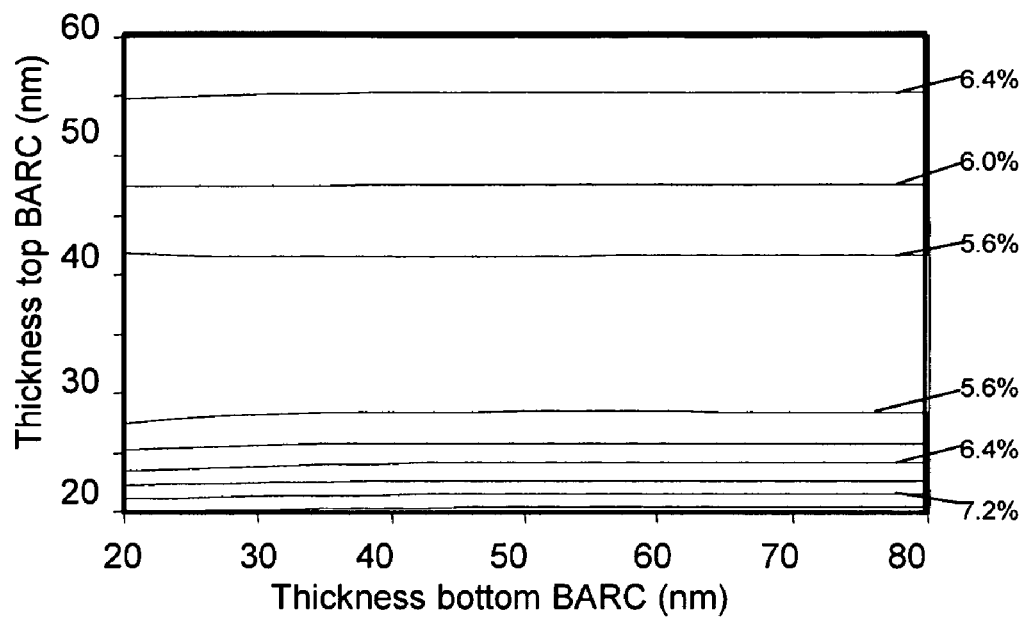
Figure 7A:
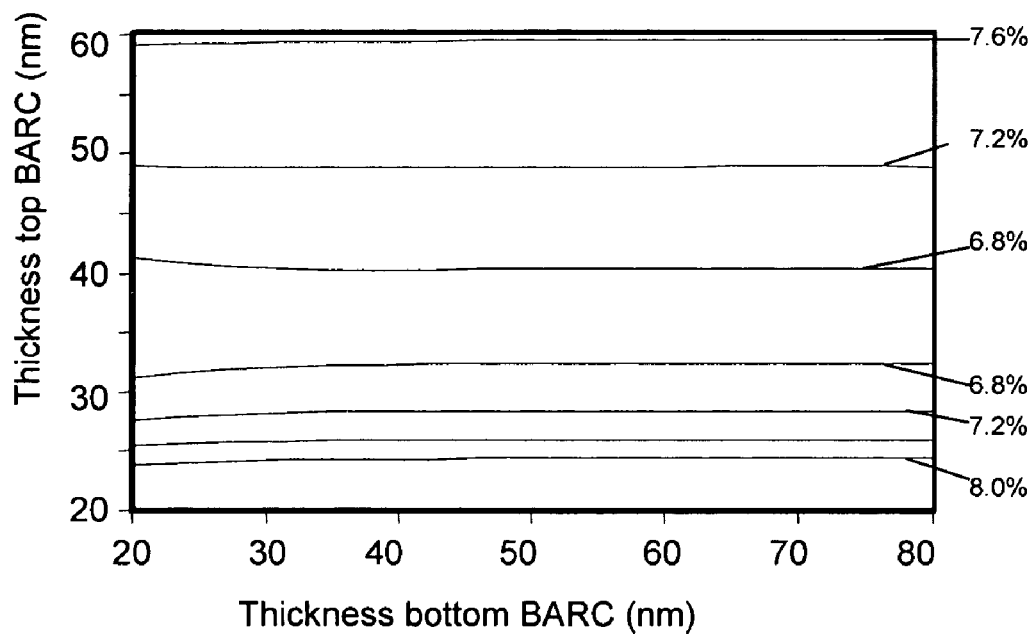
Figure 7B:
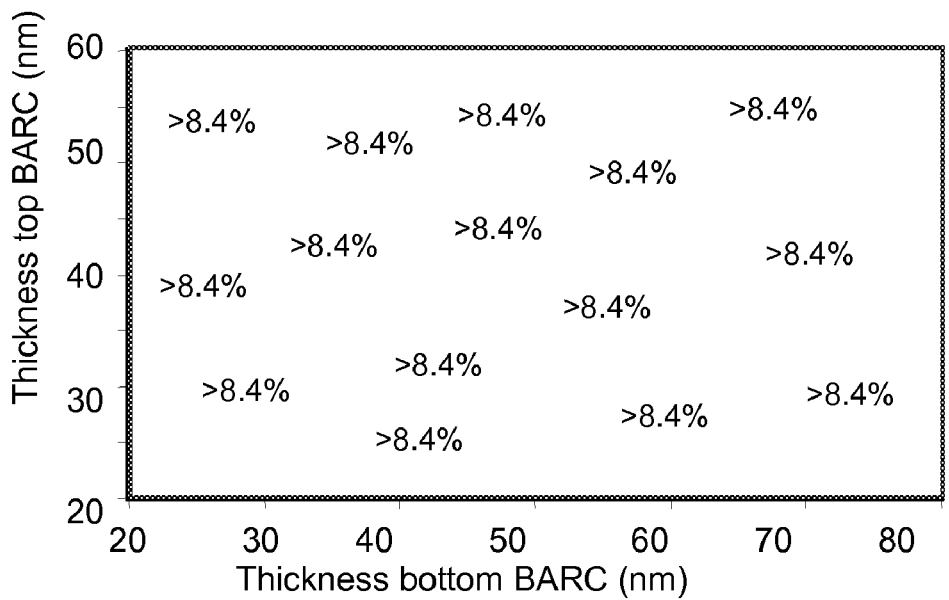
Figure 7C:
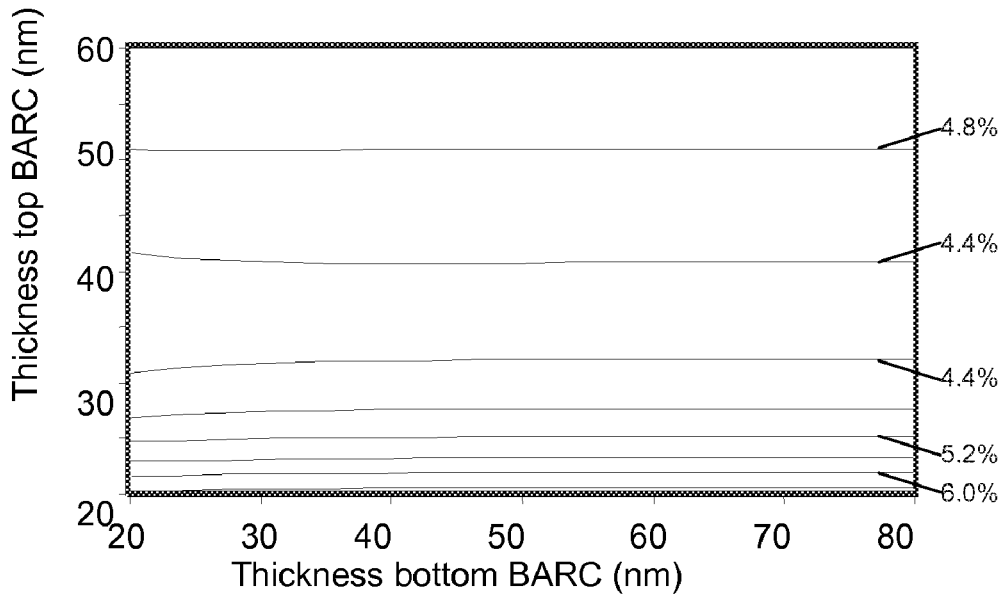
Figure 8A:
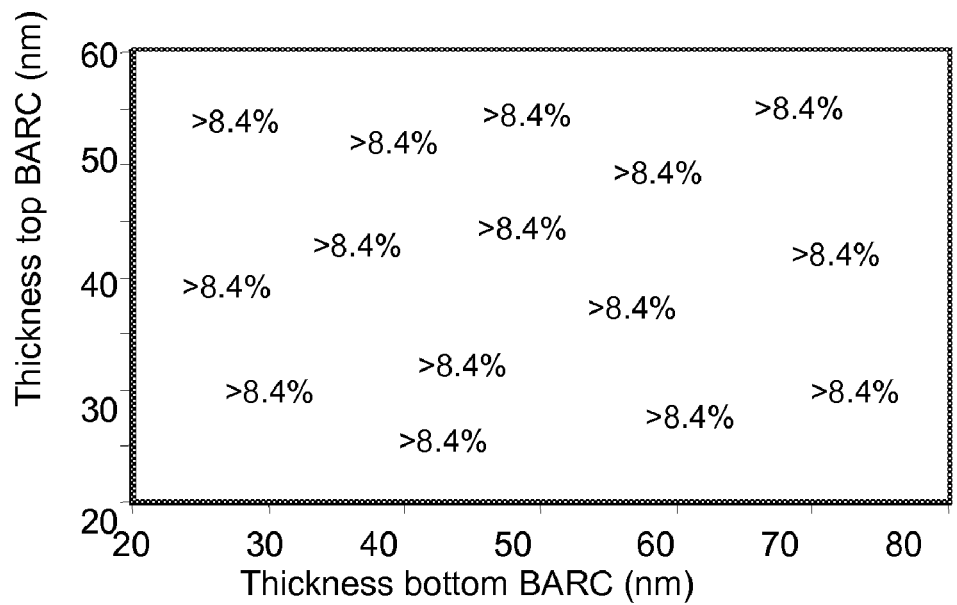
Figure 8B:
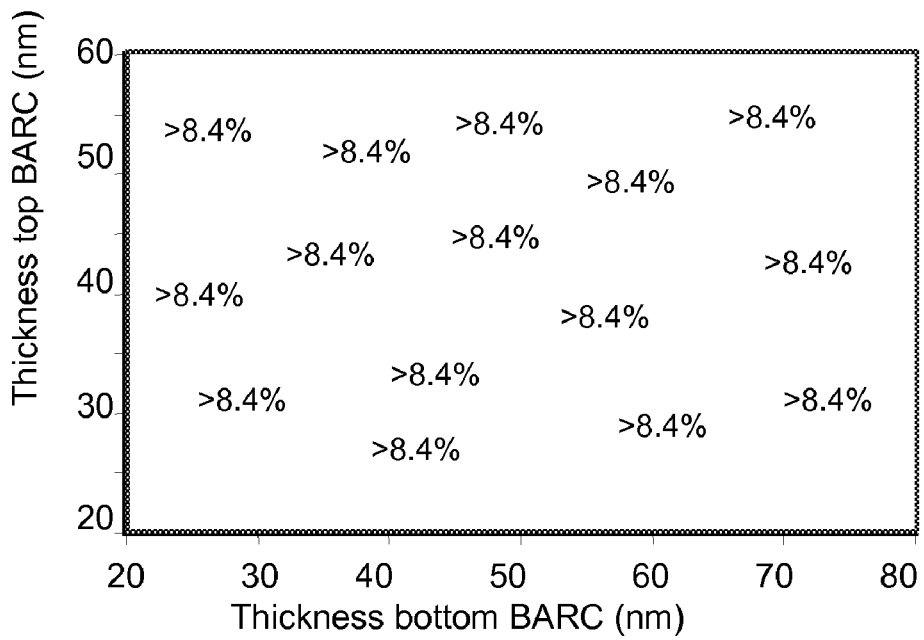
Figure 8C:
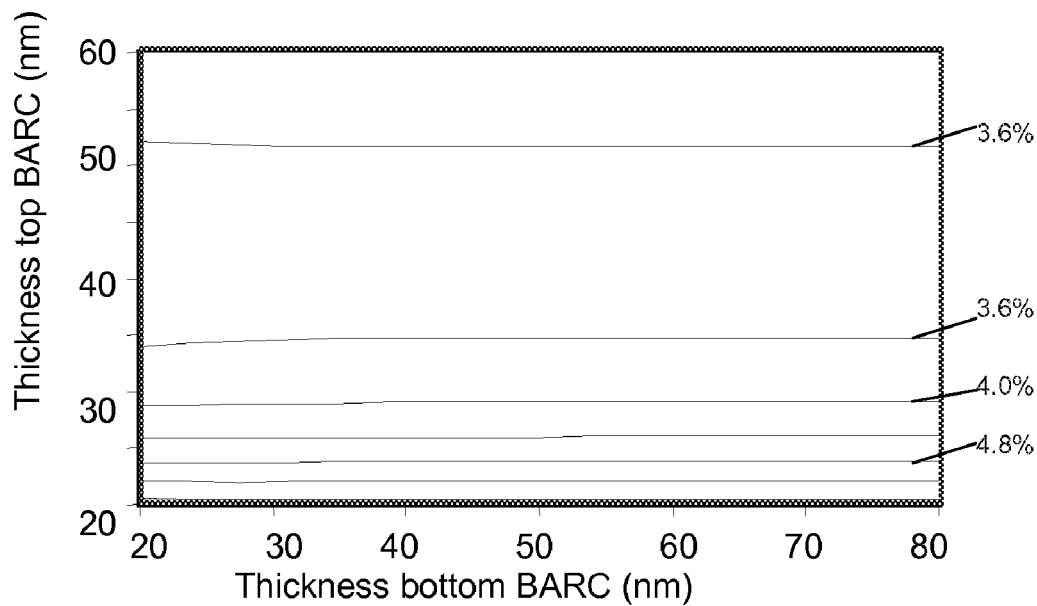
Figure 9A:
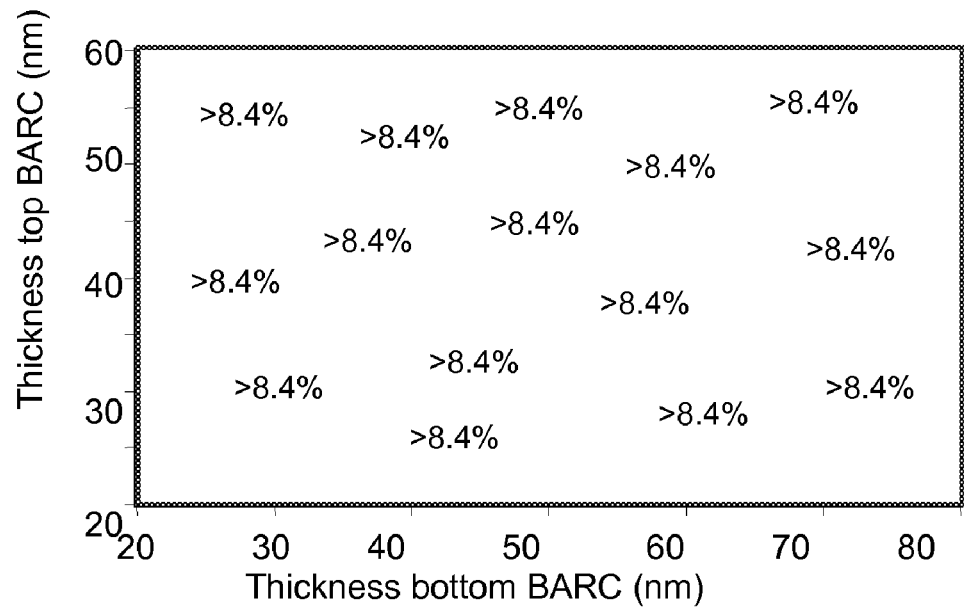
Figure 9B:
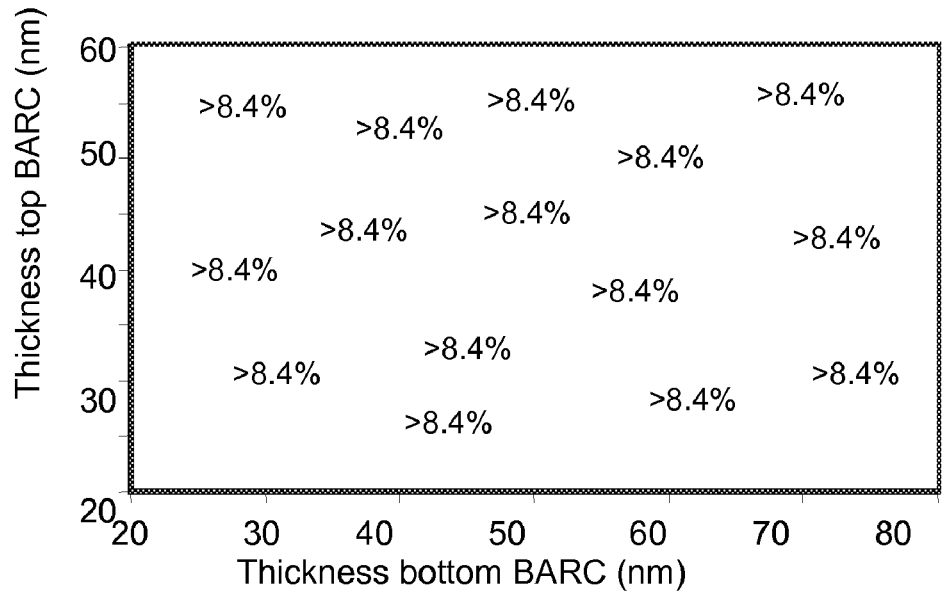
Figure 9C:
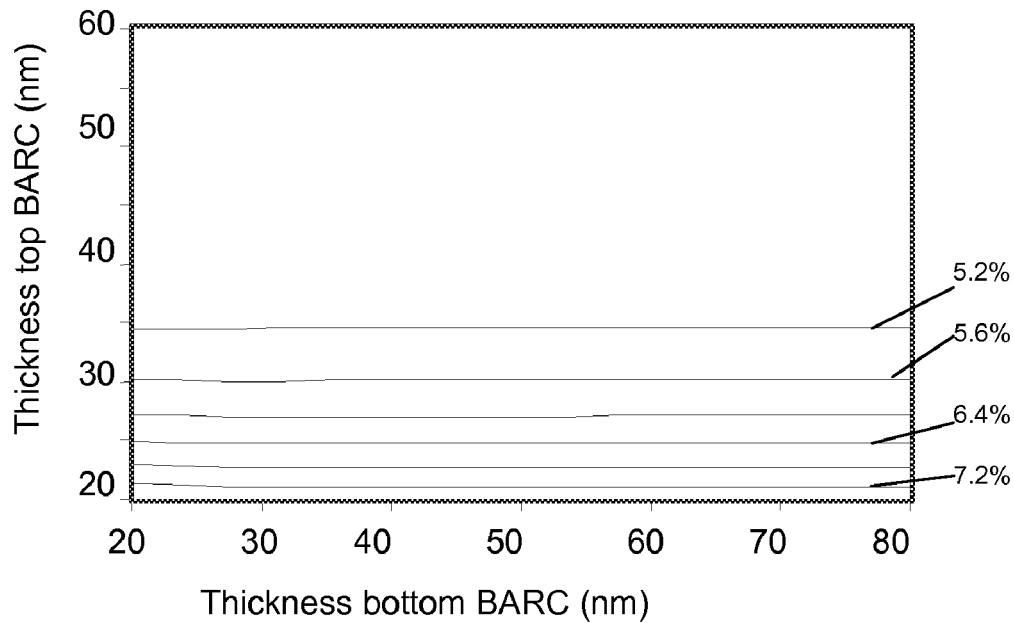

The thicknesses of the first and second bottom anti-reflective coating are used as parameters. FIG. 6a to FIG. 6c shows the results for a pitch of 500 nm. It is clear that the reflection is higher than 5% for all BARC thicknesses. Similar results can be seen for FIG. 7a to FIG. 7c, showing the results for a pitch of 130 nm. Even for the smallest pitches under test, being 90 nm (FIG. 8a to FIG. 8c) and 72 nm (FIG. 9a to FIG. 9c), the results illustrate that the reflections are too high for all simulated BARC thicknesses in the BARC stack in the test. Consequently, from these results, it can be seen that a system with substantially equal optical steps at each interface does not allow sufficient reduction the reflectivity for the described lithographic process and therefore cannot be used in the corresponding lithographic processing of substrates.

The latter can be understood as follows. The optical step encountered first by the incident light rays, at the interface between the resist layer 162 and the first BARC 172, is relatively high, due to the large difference in extinction coefficient, resulting in severe reflections, which is the problem to be solved. Therefore, this first reflection is directly illuminating the bottom of the resist, without being absorbed by any of the BARC layers. The latter is in agreement with the results for the methods according to embodiments of the present invention, indicating that the optical step at the first interface should always be very small.

In a second example, an optical system is studied wherein the dual BARC stack used between a substrate and a resist layer comprises a small optical step at the first interface resist 162/first BARC 172 and a slightly larger optical step at the second interface first BARC 172/second BARC 174. The third optical step, between bottom-BARC 174 and substrate 164, consequently is the largest one. In other words, the optical steps increase when moving from the resist to the substrate.

Figure 10:
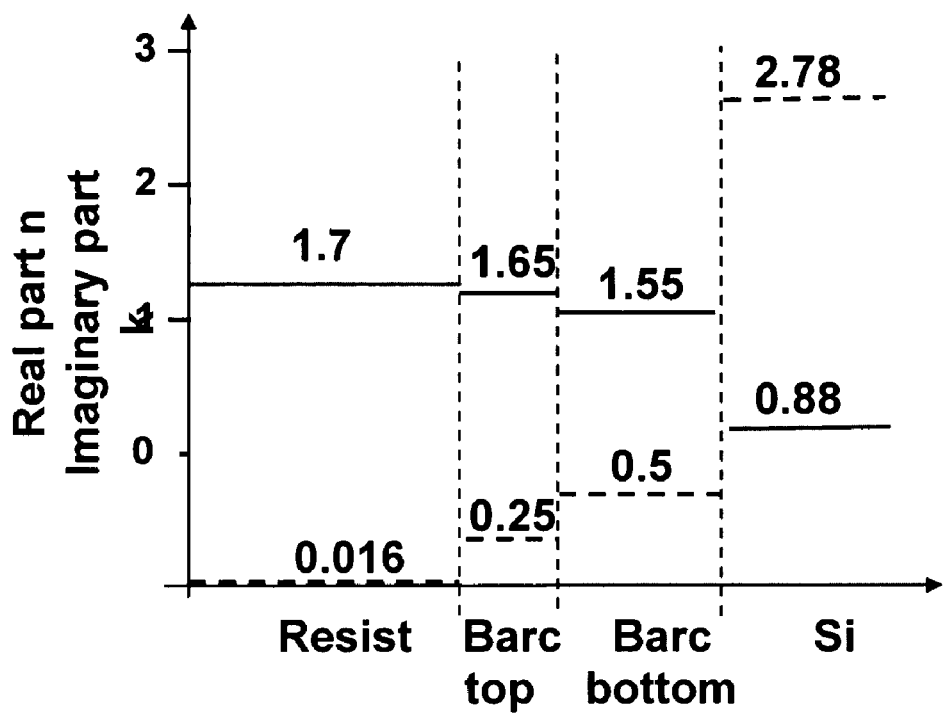
FIG. 10 shows an optical scheme for a system based on a dual BARC stack having optical parameters in agreement with the method of the first embodiment according to the present invention.
Figure 11A:
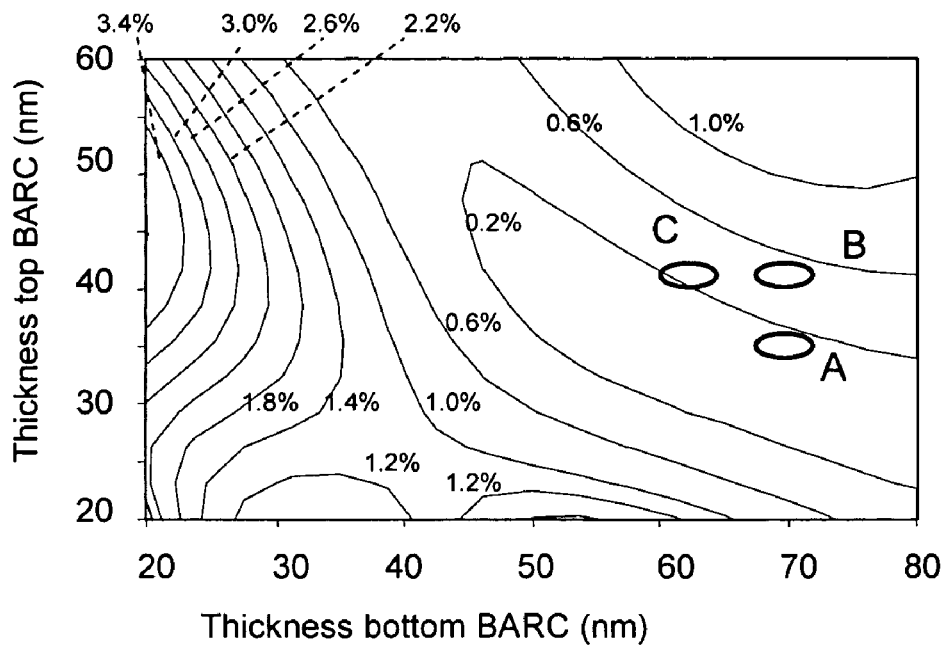
FIG. 11a to FIG. 14c show graphs of the substrate reflectivity as a function of the thicknesses of the BARC layers for a system as shown in FIG. 10 for an unpolarized light source (FIG. 11a, FIG. 12a, FIG. 13a, FIG. 14a), for an Y-polarized light source (FIG. 11b, FIG. 12b, FIG. 13b, FIG. 14b), and for an X-polarized light source (FIG. 11c, FIG. 12c, FIG. 13c, FIG. 14c) in case of a 500 nm pitch (FIG. 11a to FIG. 11c), a 130 nm pitch (FIG. 12a to FIG. 12c), a 90 nm pitch (FIG. 13a to FIG. 13c), and a 72 nm pitch (FIG. 14a to FIG. 14c)
Figure 11B:
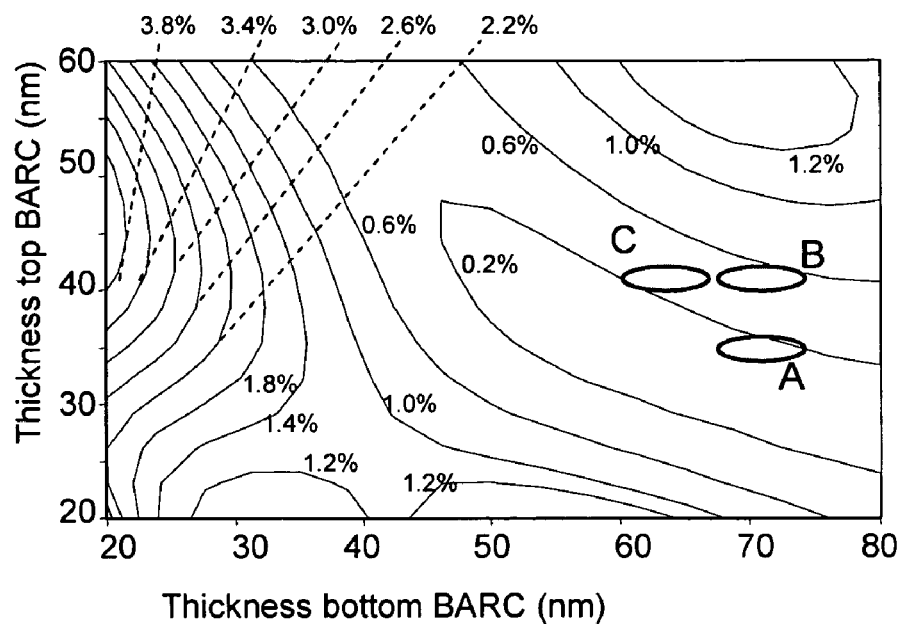
Figure 11C:
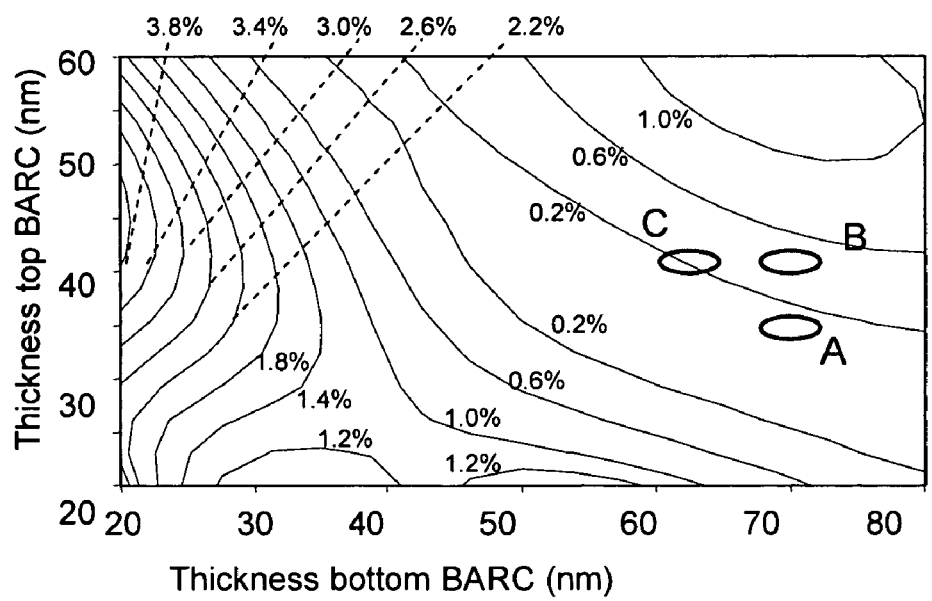
Figure 12A:
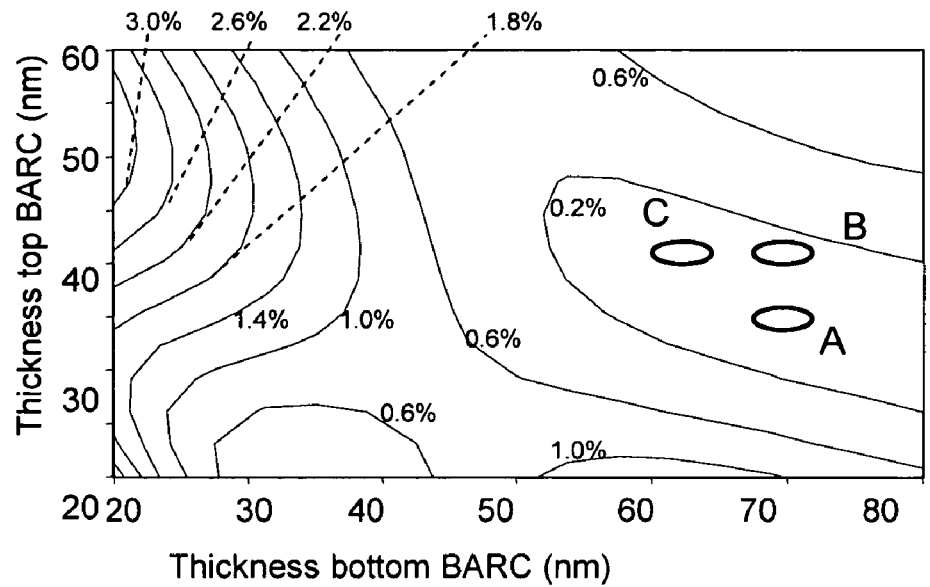
Figure 12B:
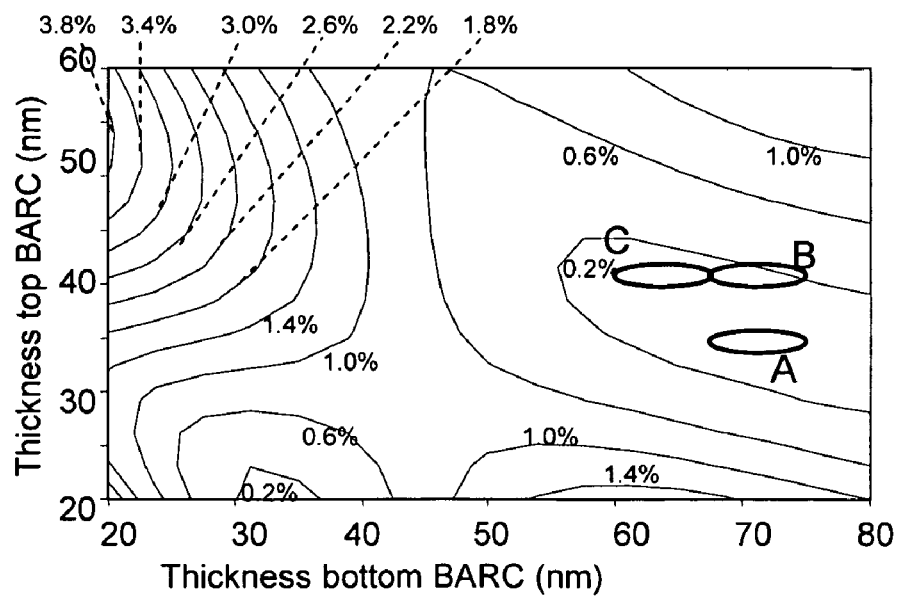
Figure 12C:
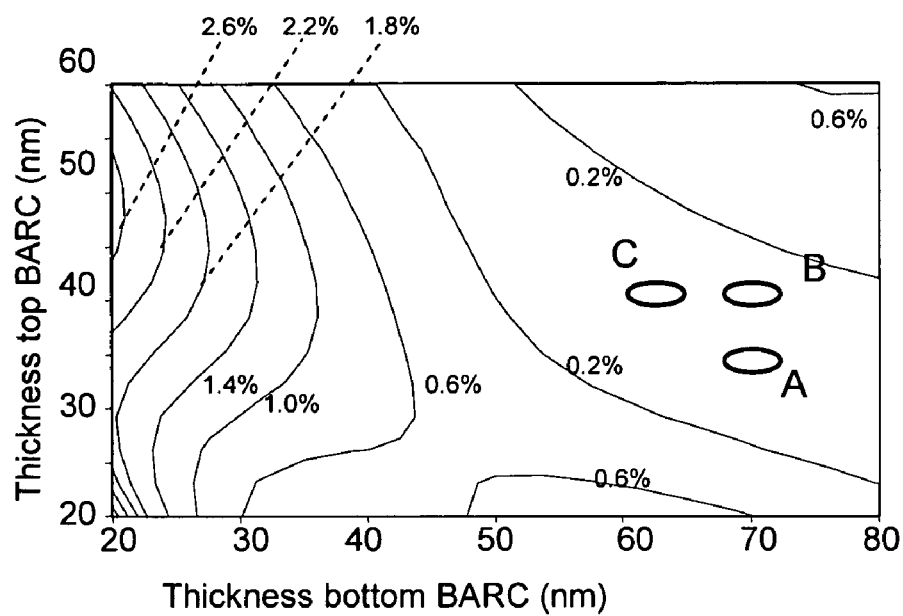
Figure 13A:
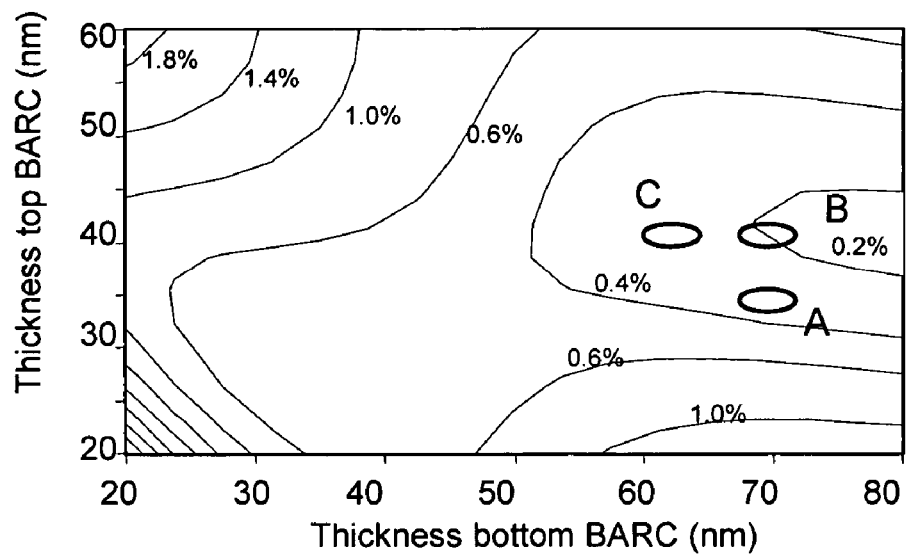
Figure 13B:
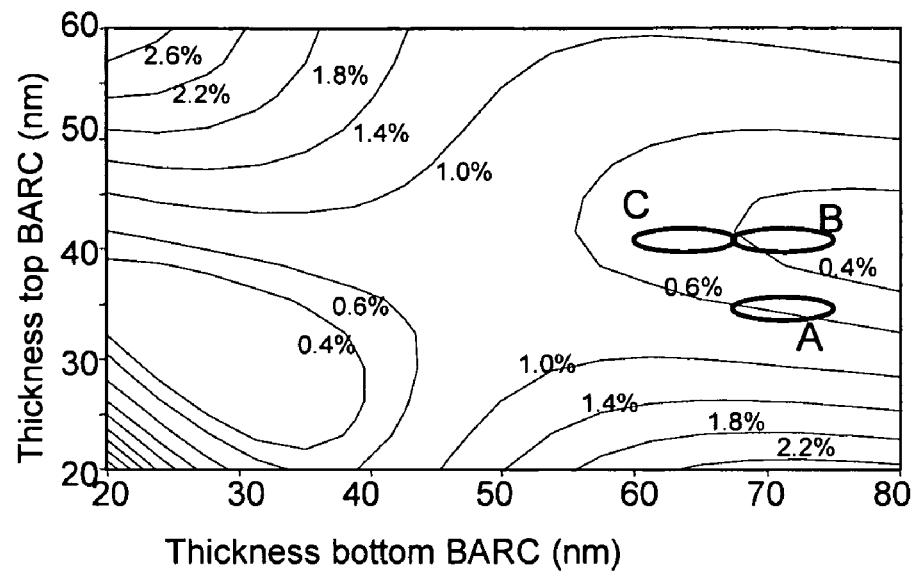
Figure 13C:
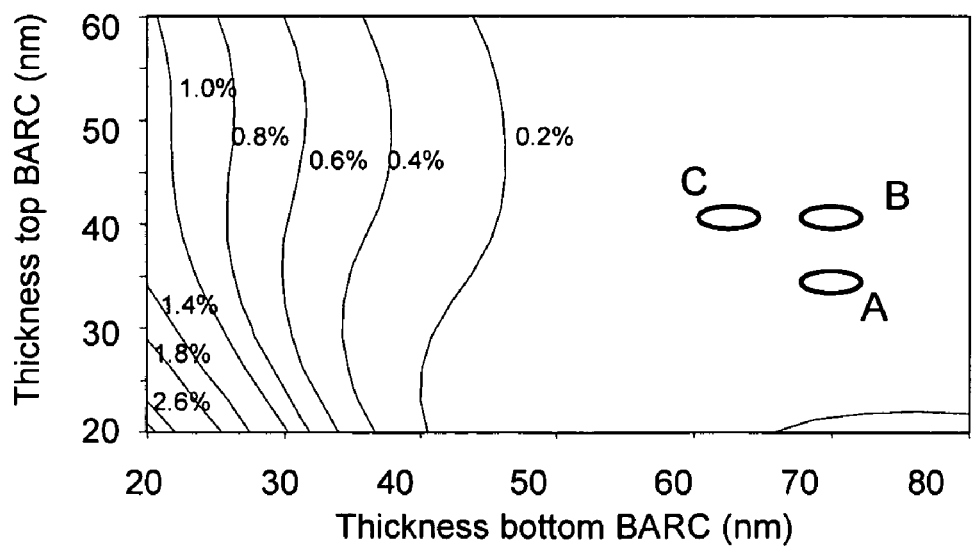
Figure 14A:
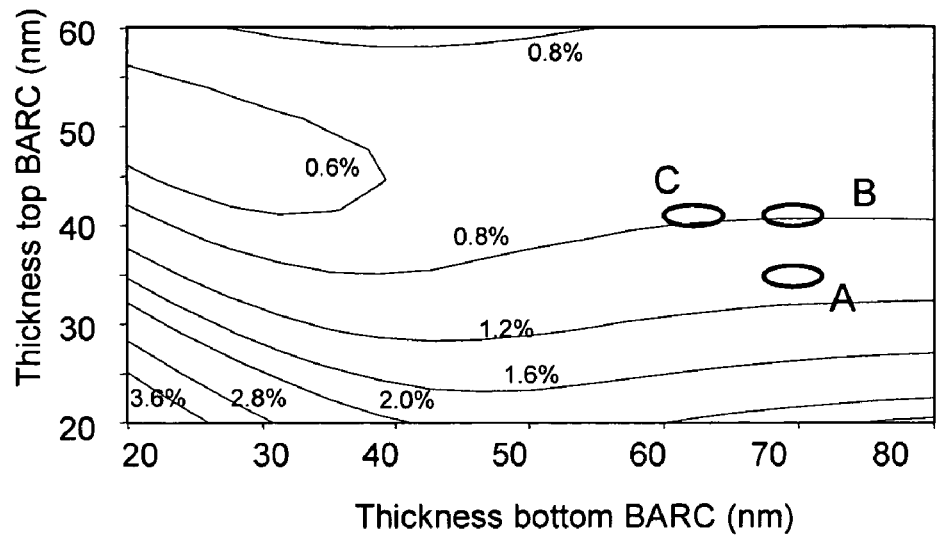
Figure 14B:
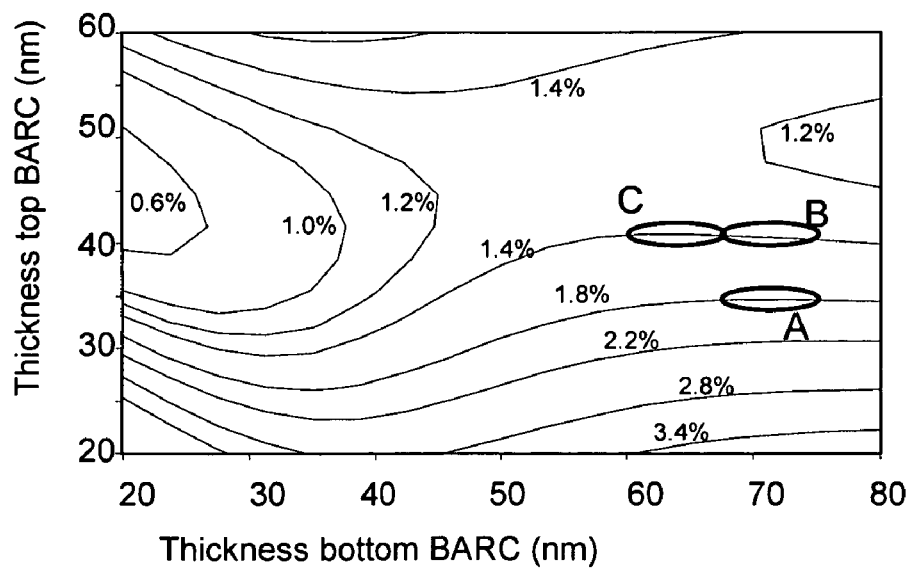
Figure 14C:
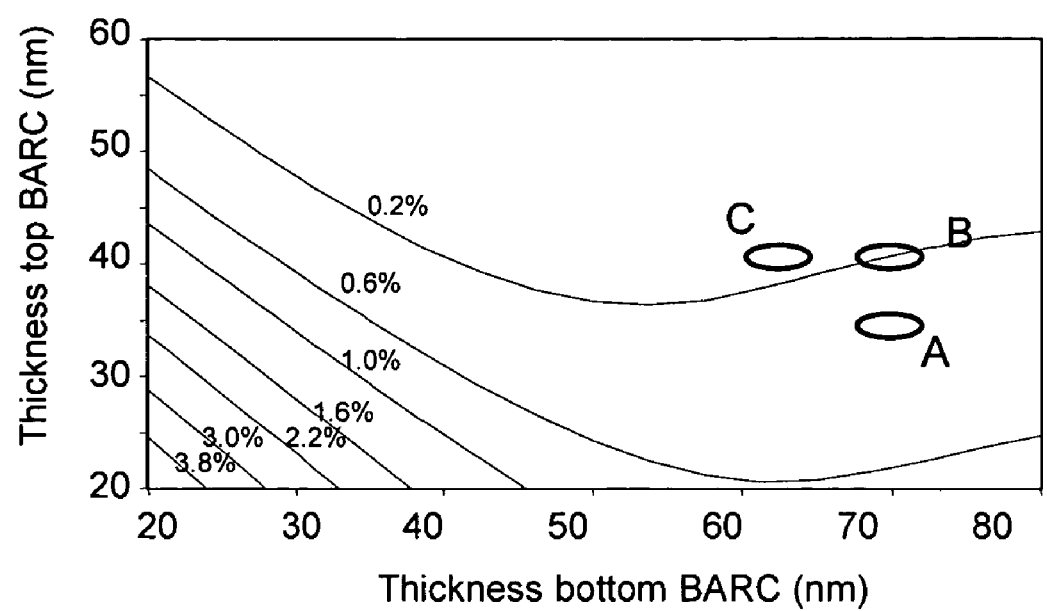

The optical scheme for this example is shown in FIG. 10, indicating the real refractive index by the full line and the extinction coefficient with the dashed line. The corresponding substrate reflection is simulated for the same patterns as before: dense lines with 500 nm pitch (FIG. 11a to FIG. 11c), 130 nm pitch (FIG. 12a to FIG. 12c), 90 nm pitch (FIG. 13a to FIG. 13c), and 72 nm pitch (FIG. 14a to FIG. 14c). Solid-c software is used for these calculations, taking into account the angle of incidence of the light rays.

As can be seen in all graphs, the reflection is much lower compared to the first example, under condition that the thicknesses of both BARC layers are selected properly. The latter illustrates the advantages of the embodiments of the present invention. Three interesting combinations of BARC thicknesses are indicated by the black ellipses, so called working points A, B, and C. If BARC thicknesses corresponding with these working points are used, substrate reflection is quite low, independent of the polarization state of the light.

Figure 15A:
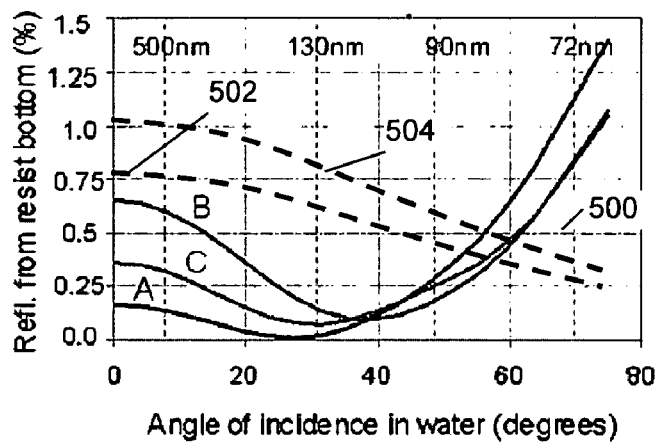
FIG. 15a to FIG. 15c illustrate the substrate reflectivity as a function of the angle of incidence for the working points indicated in FIG. 11a to FIG. 14c.
Figure 15B:
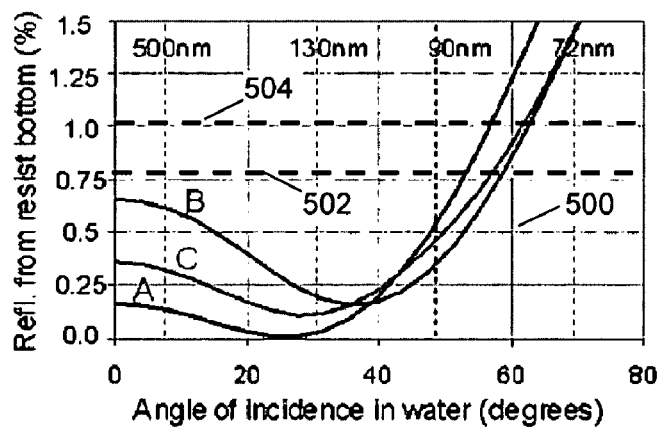
Figure 15C:
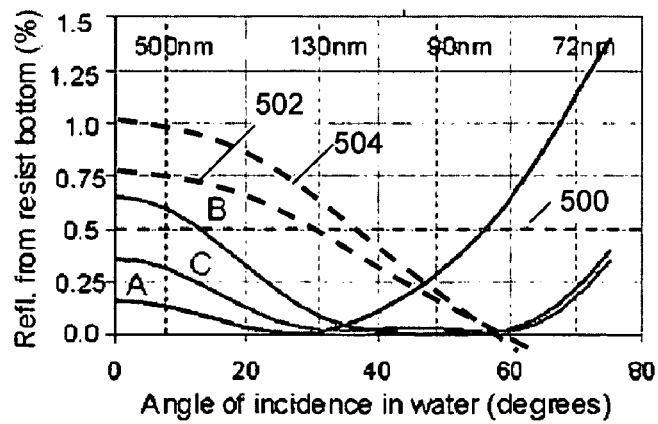

Only for the smallest pitch of 72 nm, as shown in FIG. 14a to FIG. 14c, the working points correspond to reflection levels that are not below 0.5% anymore. Whether reflection control is still sufficient for the 72 nm pitch will depend on the NILS of this pattern. In case a Y-polarized source is used, the NILS can be quite high resulting in a reflection level of 1% that still might be sufficiently low for good CD control. In other words, in order to evaluate whether the substrate reflectivity is sufficiently low, preferably a floating criterion should be used, whereby the maximum allowable substrate reflectivity is a function of the NILS value(s) for the printed pattern. The latter is illustrated in FIG. 15a to FIG. 15c, illustrating for the top and bottom BARCs with thicknesses corresponding to working points A, B, and C, the substrate reflection for different angles of incidence.

As in the present example, an alternating phase shift mask is used with zero sigma, hence each pitch corresponds with an angle of incidence. Consequently, FIG. 15a to FIG. 15c also illustrate the substrate reflectivity as a function of pitch. FIG. 15a illustrates the results for unpolarized light, FIG. 15b illustrates the results for Y-polarized light, and FIG. 15c illustrates the results for X-polarized light. Based on a fixed criterion of 0.5% allowed substrate reflection, indicated by curve 500, working point B is not a good one, since the substrate reflectivity will be too high for the larger pitches. Furthermore, for a Y-polarized source, reflection control seems to be more difficult than for an X-polarized source. Nevertheless, if a NILS dependent floating criterion is used, the conclusions are different.

Curves 502 and 504 illustrate two different NILS dependent criteria. Curve 502 shows the maximum allowable substrate reflectivity being 0.25 times the NILS, whereas curve 504 shows the maximum allowable substrate reflectivity being 0.33 times the NILS. With these floating criteria, the conclusion is different: all working points are viable, and working point B is even a very interesting one. Working point A is less interesting for smaller pitches. For a Y-polarized source, the reflection reduction is more than sufficient due to the high NILS-values obtained with this source polarization. The latter illustrates the advantages of the second embodiment of the present invention.

Figure 16:
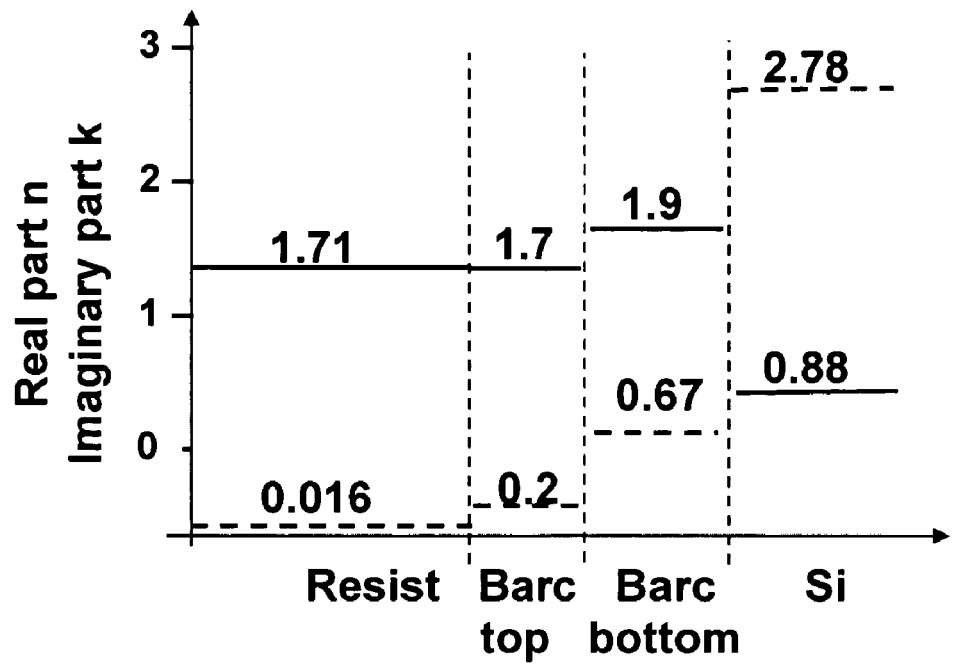
FIG. 16 shows an alternative optical scheme for a system based on a dual BARC stack having optical parameters in agreement with the method of the first embodiment according to the present invention.
Figure 17A:
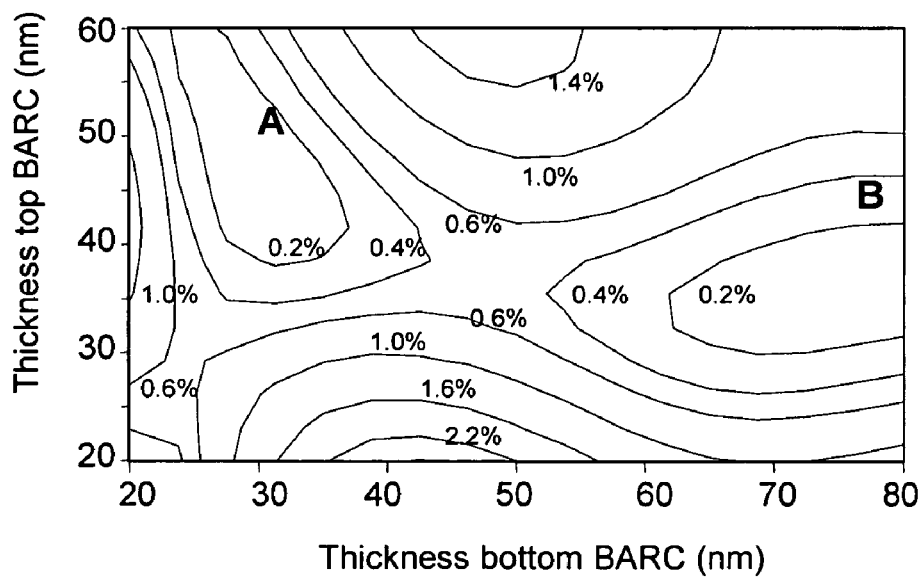
FIG. 17a to FIG. 20c show graphs of the substrate reflectivity as a function of the thicknesses of the BARC layers for a system as shown in FIG. 16 for an unpolarized light source (FIG. 17a, FIG. 18a, FIG. 19a, FIG. 20a), for an Y-polarized light source (FIG. 17b, FIG. 18b, FIG. 19b, FIG. 20b), and for an X-polarized light source (FIG. 17c, FIG. 18c, FIG. 19c, FIG. 20c) in case of a 500 nm pitch (FIG. 17a to FIG. 17c), a 130 nm pitch (FIG. 18a to FIG. 18c), a 90 nm pitch (FIG. 19a to FIG. 19c), and a 72 nm pitch (FIG. 20a to FIG. 20c).
Figure 17B:
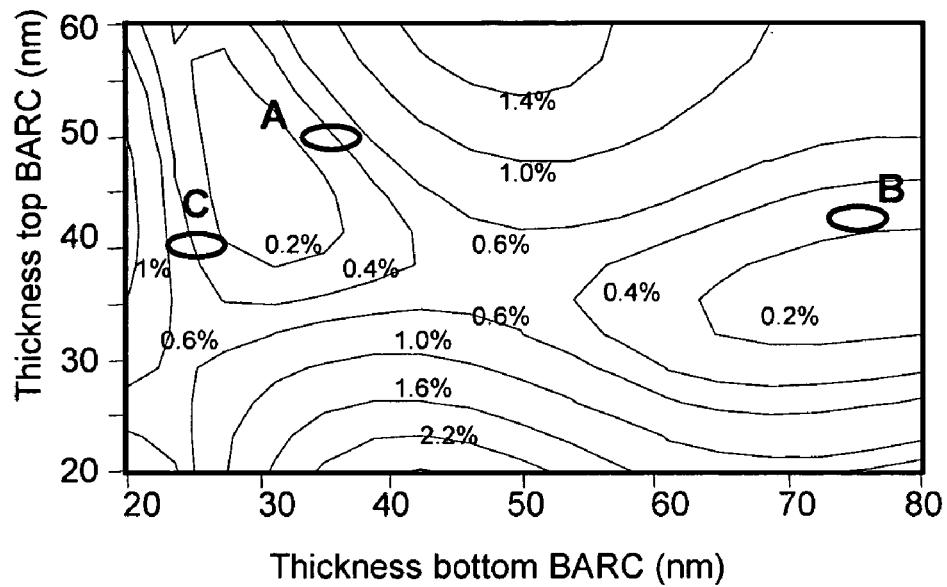
Figure 17C:
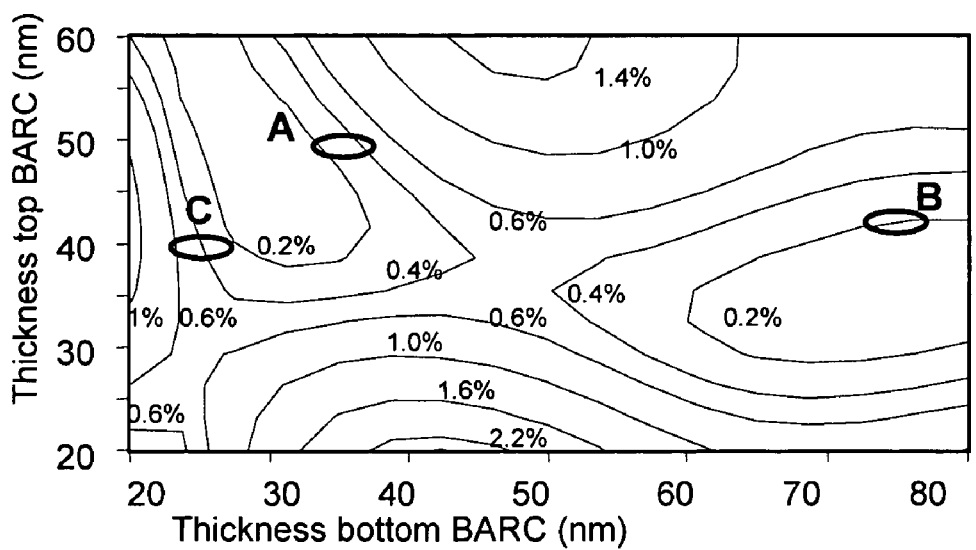
Figure 18A:
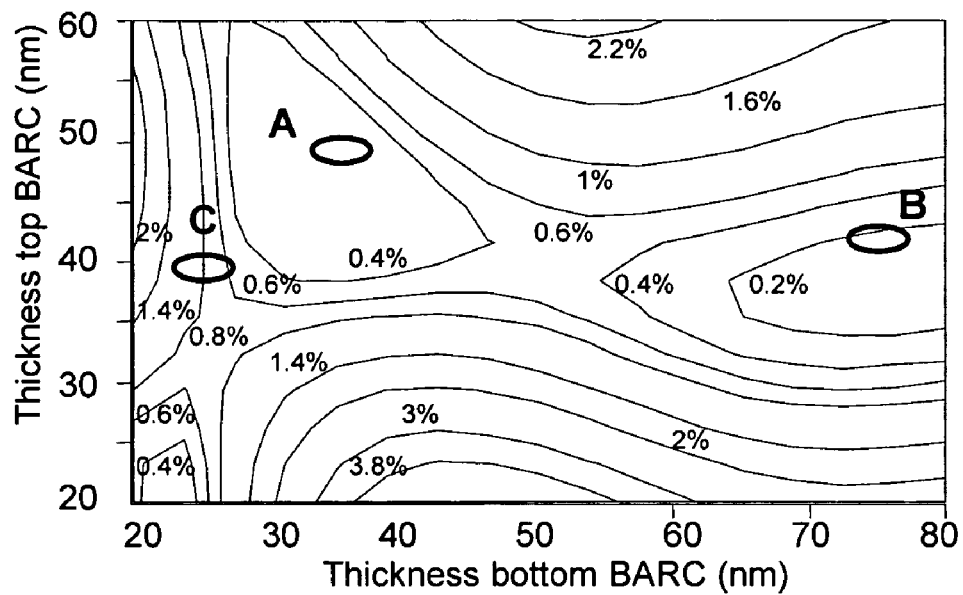
Figure 18B:
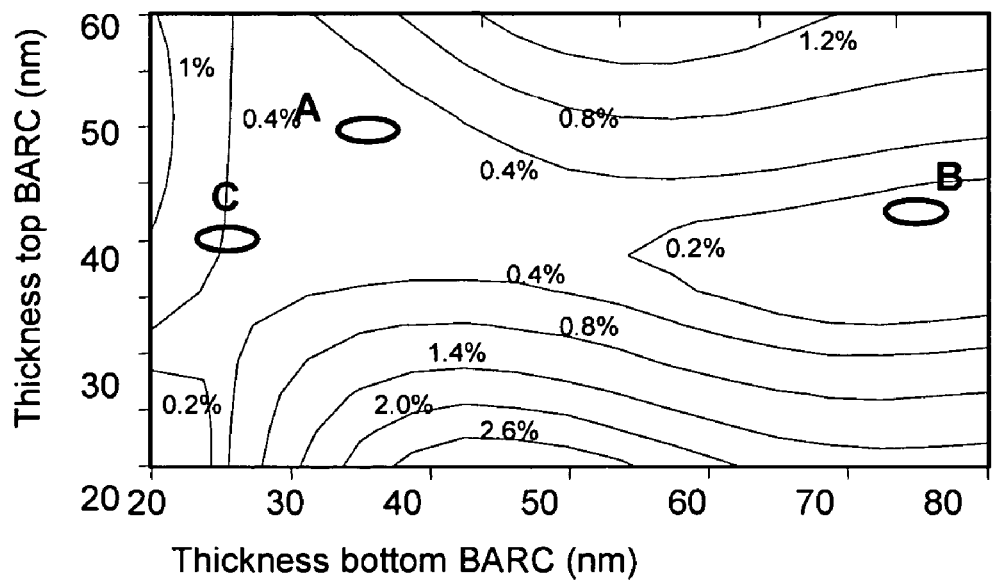
Figure 18C:
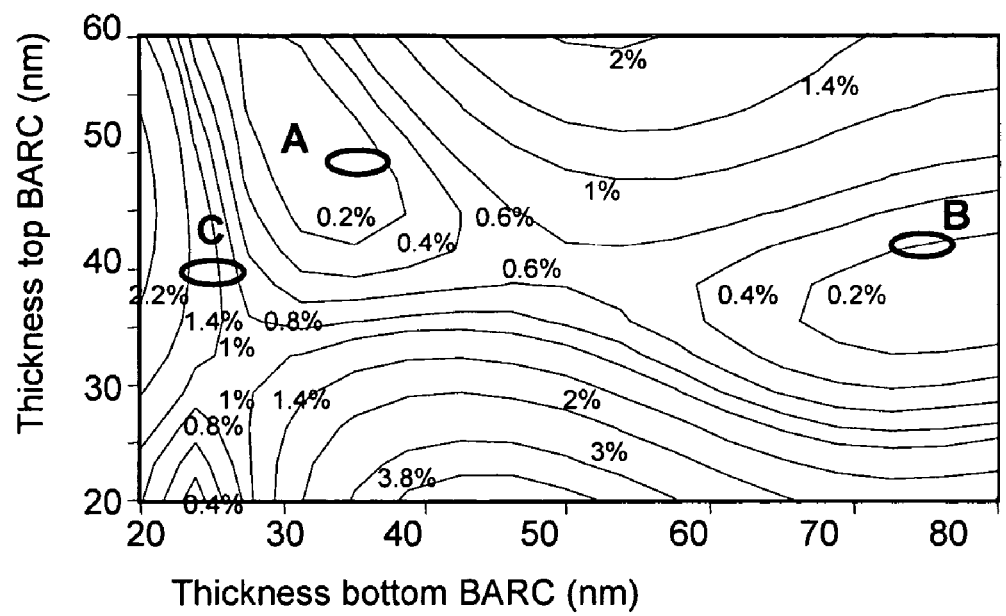
Figure 19A:
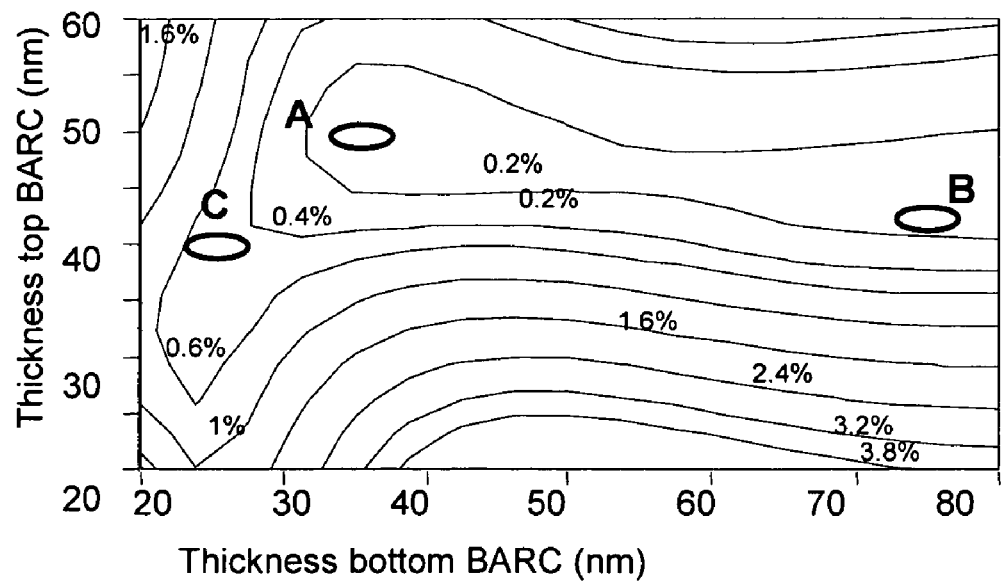
Figure 19B:
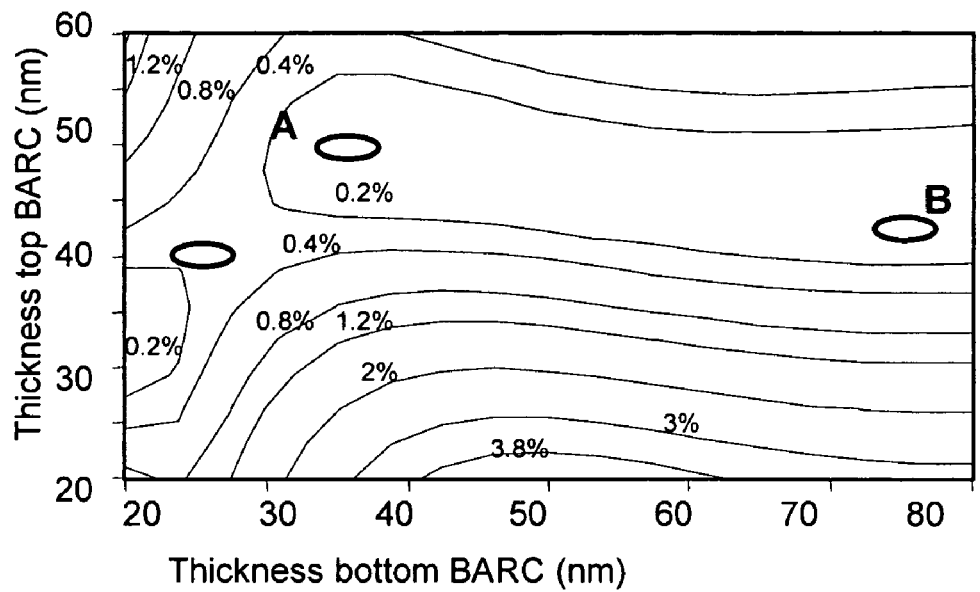
Figure 19C:
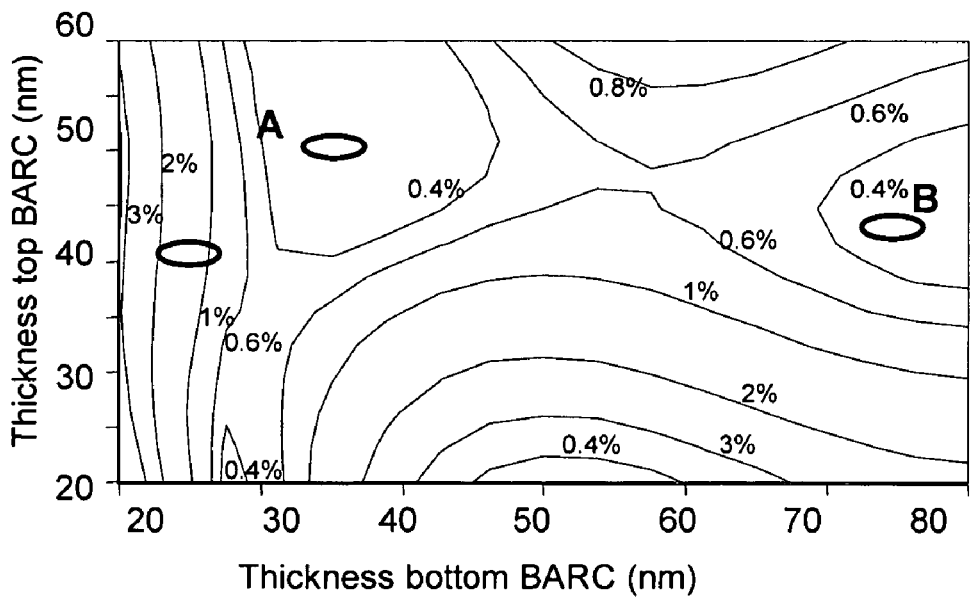

In a third example, a similar optical system is tested whereby a small optical step is present at the first interface being the resist 162/first BARC 172 interface and wherein at the second interface, being the first BARC 172/second BARC 174, a slightly larger optical step is present. Nevertheless, the optical step at the second interface is such that the value of the real refractive index for the second BARC is higher than the real refractive index of the resist layer and the first BARC. The latter is indicated in the optical scheme shown in FIG. 16.

The real refractive index is shown by the full line, whereas the extinction coefficient is shown with the dashed line. The system is based on a silicon substrate and a resist layer having a real refractive index 1.71, the real refractive index being indicated with the full line, and an extinction coefficient of 0.016, the extinction coefficient being indicated with the dashed line. The real refractive index of the first BARC is 1.7, being slightly smaller than the real refractive index of the resist layer, and the real refractive index of the second BARC is 1.9, being larger than the real refractive index of the resist layer.

Figure 20A:
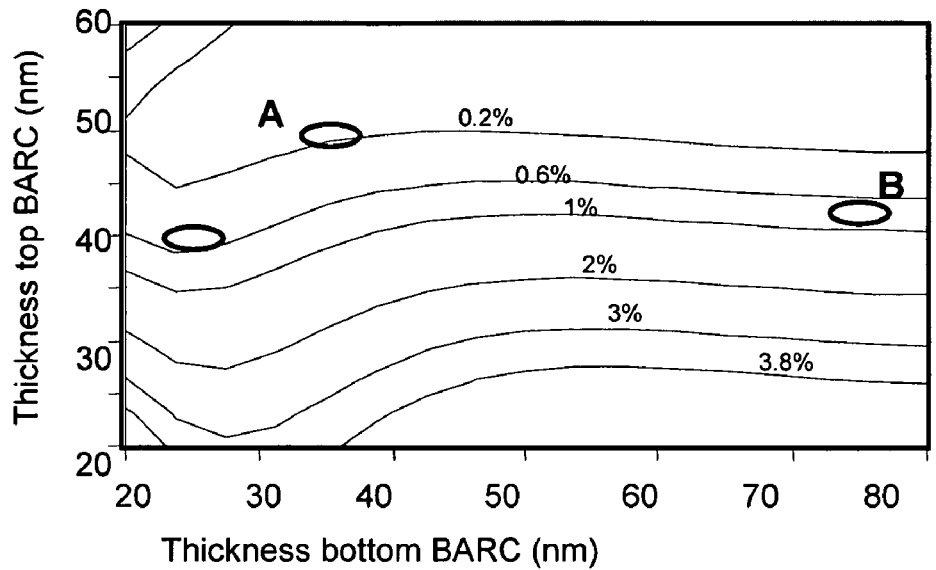
Figure 20B:
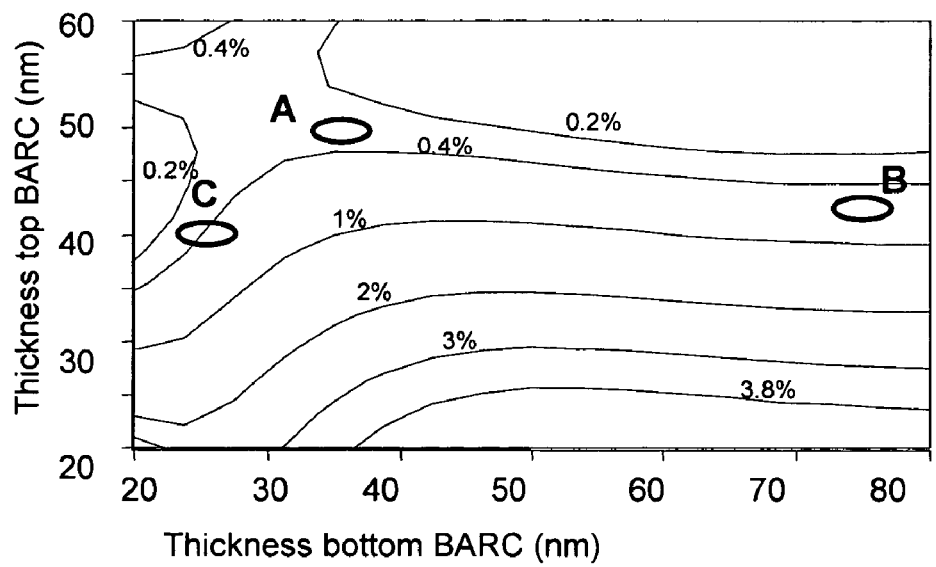
Figure 20C:
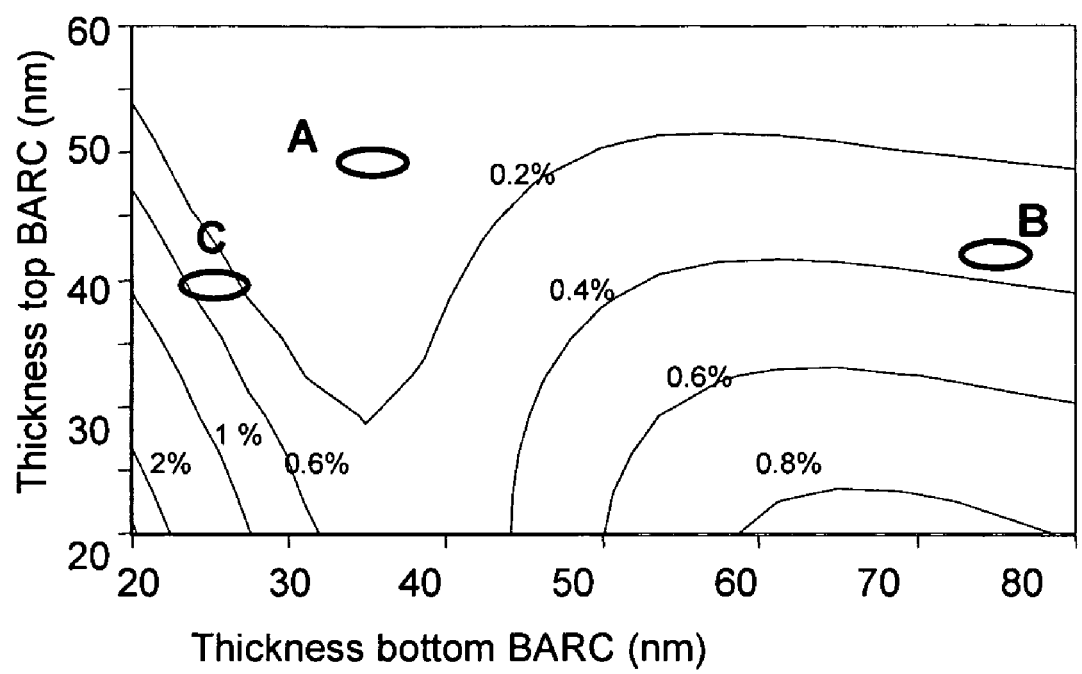

Corresponding substrate reflectivity calculations are shown in FIG. 17a to FIG. 20c as a function of both BARC thicknesses. The results indicate the substrate reflectivity for a 500 nm pitch (FIG. 17a to FIG. 17c), for a 130 nm pitch (FIG. 18a to FIG. 18c), for a 90 nm pitch (FIG. 19a to FIG. 19c), and for a 72 nm pitch (FIG. 20a to FIG. 20c). Again three interesting working points indicated by black ellipses A, B, and C are shown, defining optimal BARC thicknesses for which the substrate reflectivity is relatively low. To find out if these working points correspond to BARC-stacks offering sufficient reflection control, again a comparison should by made with a NILS dependent CSR. For this example such a comparison revealed that all working conditions are good, but condition A is clearly superior with respect to reflection control. Nevertheless, it is to be noticed that for selection of the optimal BARC and BARC thicknesses, not only the reflection control but also compatibility and integration effects are important.

It is to be understood that although preferred embodiments, specific constructions and configurations, as well as materials, have been discussed herein for devices according to the present invention, various changes or modifications in form and detail may be made without departing from the scope and spirit of this invention. For example, although the present invention is illustrated by way of examples of dual BARC stacks, the present invention is not limited thereto and a stack of more than two bottom anti-reflective coatings may be used.

I claim:

1. A method for setting up lithographic processing of a substrate, the method comprising using a stack comprising a number of bottom anti-reflective coatings in between a resist layer and the substrate thus creating a number of optical interfaces, the bottom anti-reflective coatings having at least a first bottom anti-reflective coating adjacent the resist layer and at least a second bottom anti-reflective coating adjacent the first bottom anti-reflective coating, comprising:

selecting a real refractive index and an extinction coefficient of each of the bottom anti-reflective coatings such that an optical step at an interface resist/first bottom anti-reflective coating is smaller than an average optical step per interface for traversing from the resist to the substrate, the extinction coefficients of the bottom anti-reflective coatings are selected to be increasing at each optical interface when traversing from the resist layer to the substrate, and the real refractive indices of the bottom anti-reflective coatings are selected to be decreasing at each optical interface when traversing from the resist layer to the substrate.

2. The method of claim 1, wherein the real refractive index $n_{1BARC}$ and an extinction coefficient $k_{1BARC}$ of the first bottom anti-reflective coating and the real refractive index $n_{2BARC}$ and an extinction coefficient $k_{2BARC}$ of the second bottom anti-reflective coating are selected such that the optical step at the interface first bottom anti-reflective coating/second bottom anti-reflective coating is less than the average optical step per interface and the optical step at the interface first bottom anti-reflective coating/second anti-reflective coating is larger than the optical step at the interface resist/first bottom anti-reflective coating.

3. The method of claim 2, wherein the optical step at the interface first bottom anti-reflective coating/second bottom anti-reflective coating is less than 20% of the average optical step per interface and the optical step at the interface first bottom anti-reflective coating/second anti-reflective coating is less than 20% of the average optical step per interface.

4. The method of claim 1, wherein the thickness of the first bottom anti-reflective coating and the thickness of the second bottom anti-reflective coating are obtained by:

selecting values for each of the thickness parameters;

determining the substrate reflectivity based on the selected values for each of the thickness parameters; and evaluating whether the reflectivity is equal to or smaller than a maximum allowable reflectivity.

5. The method of claim 4, further comprising, prior to the determining the reflectivity, selecting values for a thickness of the substrate or layers thereof, wherein the determining the reflectivity in the resist layer is based on the selected thickness of the substrate or layers thereof.

6. The method of claim 4, wherein the maximum allowable reflectivity is determined as a function of a normalized image log-slope related parameter for the lithographic processing.

7. The method of claim 4, wherein the substrate reflectivity is determined by taking into account an angle of incidence of light rays incident on at least one of the substrate, the BARCs, and the resist layer.

8. A method for lithographic processing of a device, comprising:

using a stack comprising a number of BARC layers in between a resist and a substrate, the BARC layers comprising at least a first bottom anti-reflective coating and at least a second bottom anti-reflective coating, the at least one first bottom anti-reflective coating and the at least one second bottom anti-reflective coating being selected by selecting the real refractive index and the extinction coefficient of each of the bottom anti-reflective coatings such that an optical step at the interface resist/first bottom anti-reflective coating is smaller than an average optical step per interface for traversing from the resist to the substrate, the extinction coefficients of the bottom anti-reflective coatings are selected to be increasing at each optical interface when traversing from the resist layer to the substrate, and the real refractive indices of the bottom anti-reflective coatings are selected to be decreasing at each optical interface when traversing from the resist layer to the substrate.

9. The method of claim 8, wherein the real refractive index $n_{1BARC}$ and an extinction coefficient $k_{1BARC}$ of the first bottom anti-reflective coating and the real refractive index $n_{2BARC}$ and an extinction coefficient $k_{2BARC}$ of the second bottom anti-reflective coating are selected such that the optical step at the interface first bottom anti-reflective coating/second bottom anti-reflective coating is less than the average optical step per interface and the optical step at the interface first bottom anti-reflective coating/second anti-reflective coating is larger than the optical step at the interface resist/first bottom anti-reflective coating, the optical step at the interface first bottom anti-reflective coating/second bottom anti-reflective coating is less than 20% of the average optical step per interface and the optical step at the interface first bottom anti-reflective coating/second anti-reflective coating is less than 20% of the average optical step per interface.

10. A non-transitory computer program product for executing a method for setting up lithographic processing of a substrate, the method comprising using a stack comprising a number of bottom anti-reflective coatings in between a resist layer and the substrate thus creating a number of optical interfaces, the bottom anti-reflective coatings having at least a first bottom anti-reflective coating adjacent the resist layer and at least a second bottom anti-reflective coating adjacent the first bottom anti-reflective coating, comprising:

a processor;

data storage;

program instructions stored in the data storage and executable by the processor to perform functions including:

selecting optical parameters of each of the bottom anti-reflective coatings such that an optical step at an interface resist/first bottom anti-reflective coating is smaller than an average optical step per interface for traversing from the resist to the substrate, the extinction coefficients of the bottom anti-reflective coatings are selected to be increasing at each optical interface when traversing from the resist layer to the substrate, and the real refractive indices of the bottom anti-reflective coatings are selected to be decreasing at each optical interface when traversing from the resist layer to the substrate.

11. The non-transitory computer program product of claim 10, wherein the computer program product is transmitted over a local or wide area telecommunications network.

\* \* \* \* \*